(12) United States Patent
Sun et al.

(10) Patent No.: US 9,679,613 B1
(45) Date of Patent: Jun. 13, 2017

(54) TFD I/O PARTITION FOR HIGH-SPEED, HIGH-DENSITY APPLICATIONS

(71) Applicant: Invensas Corporation, San Jose, CA (US)

(72) Inventors: Zhuowen Sun, Campbell, CA (US); Kyong-Mo Bang, Fremont, CA (US); Belgacem Haba, Saratoga, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/148,726

(22) Filed: May 6, 2016

(51) Int. Cl.
| | | |
|---|---|---|
| *G11C 5/06* | (2006.01) | |
| *G11C 8/00* | (2006.01) | |
| *G11C 5/02* | (2006.01) | |
| *H01L 25/065* | (2006.01) | |
| *G11C 11/408* | (2006.01) | |

(52) U.S. Cl.
CPC ............... *G11C 5/02* (2013.01); *G11C 5/063* (2013.01); *G11C 11/408* (2013.01); *H01L 25/0652* (2013.01); *G11C 5/06* (2013.01); *G11C 8/00* (2013.01); *H01L 2225/0651* (2013.01); *H01L 2225/06562* (2013.01)

(58) Field of Classification Search
CPC .................................... G11C 5/06; G11C 8/00
USPC ...................................................... 365/51, 63
See application file for complete search history.

(56) References Cited

U.S. PATENT DOCUMENTS

| | | |
|---|---|---|
| 3,670,208 A | 6/1972 | Hovnanian et al. |
| 4,599,634 A | 7/1986 | Culmer et al. |
| 4,747,081 A | 5/1988 | Heilveil et al. |

(Continued)

FOREIGN PATENT DOCUMENTS

| | | |
|---|---|---|
| CN | 1477688 A | 2/2004 |
| CN | 101149964 A | 3/2008 |

(Continued)

OTHER PUBLICATIONS

International Search Report and Written Opinion for Application No. PCT/US2012/058423 dated Mar. 20, 2013.

(Continued)

*Primary Examiner* — Ly D Pham
(74) *Attorney, Agent, or Firm* — Lerner, David, Littenberg, Krumholz & Mentlik, LLP

(57) ABSTRACT

A microelectronic package can include a substrate having first and second surfaces, first, second, and third microelectronic elements each having a surface facing the first surface, terminals exposed at the second surface, and leads electrically connected between contacts of each microelectronic element and the terminals. The substrate can have first, second, and third spaced-apart apertures having first, second, and third parallel axes extending in directions of the lengths of the apertures. The contacts of the first, second, and third microelectronic elements can be aligned with one of the first, second, or third apertures. The terminals can include first and second sets of first terminals configured to carry address information. The first set can be connected with the first and third microelectronic elements and not with the second microelectronic element, and the second set can be connected with the second microelectronic element and not with the first or third microelectronic elements.

9 Claims, 5 Drawing Sheets

(56) References Cited

U.S. PATENT DOCUMENTS

| | | |
|---|---|---|
| 5,148,265 A | 9/1992 | Khandros et al. |
| 5,148,266 A | 9/1992 | Khandros et al. |
| 5,163,024 A | 11/1992 | Heilveil et al. |
| 5,210,639 A | 5/1993 | Redwine et al. |
| 5,480,840 A | 1/1996 | Barnes et al. |
| 5,679,977 A | 10/1997 | Khandros et al. |
| 5,691,570 A | 11/1997 | Kozuka |
| 5,751,553 A | 5/1998 | Clayton |
| 5,777,391 A | 7/1998 | Nakamura et al. |
| 5,821,614 A | 10/1998 | Hashimoto et al. |
| 5,899,705 A | 5/1999 | Akram |
| 5,929,517 A | 7/1999 | Distefano et al. |
| 5,936,305 A | 8/1999 | Akram |
| 5,949,700 A | 9/1999 | Furukawa et al. |
| 5,973,403 A | 10/1999 | Wark |
| 6,086,386 A | 7/2000 | Fjelstad et al. |
| 6,130,116 A | 10/2000 | Smith et al. |
| 6,159,837 A | 12/2000 | Yamaji et al. |
| 6,177,636 B1 | 1/2001 | Fjelstad |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,313,532 B1 | 11/2001 | Shimoishizaka et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,426,560 B1 | 7/2002 | Kawamura et al. |
| 6,433,422 B1 | 8/2002 | Yamasaki |
| 6,445,594 B1 | 9/2002 | Nakagawa et al. |
| 6,452,266 B1 | 9/2002 | Iwaya et al. |
| 6,461,895 B1 | 10/2002 | Liang et al. |
| 6,462,423 B1 | 10/2002 | Akram et al. |
| 6,518,794 B2 | 2/2003 | Coteus et al. |
| 6,521,981 B2 | 2/2003 | Miyazaki et al. |
| 6,560,134 B2 | 5/2003 | Brox et al. |
| 6,577,004 B1 | 6/2003 | Rumsey et al. |
| 6,611,057 B2 | 8/2003 | Mikubo et al. |
| 6,617,695 B1 | 9/2003 | Kasatani |
| 6,619,973 B2 | 9/2003 | Perino et al. |
| 6,620,648 B2 | 9/2003 | Yang |
| 6,628,528 B2 | 9/2003 | Schoenborn |
| 6,633,078 B2 | 10/2003 | Hamaguchi et al. |
| 6,658,530 B1 | 12/2003 | Robertson et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,943,057 B1 | 9/2005 | Shim et al. |
| 6,977,440 B2 | 12/2005 | Pflughaupt et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,074,696 B1 | 7/2006 | Frankowsky et al. |
| 7,091,064 B2 | 8/2006 | Jiang |
| 7,122,897 B2 | 10/2006 | Aiba et al. |
| 7,123,497 B2 | 10/2006 | Matsui et al. |
| 7,138,709 B2 | 11/2006 | Kumamoto |
| 7,141,879 B2 | 11/2006 | Wakamiya et al. |
| 7,145,226 B2 | 12/2006 | Kumamoto |
| 7,151,319 B2 | 12/2006 | Iida et al. |
| 7,164,149 B2 | 1/2007 | Matsubara |
| 7,170,158 B2 | 1/2007 | Choi et al. |
| 7,262,507 B2 | 8/2007 | Hino et al. |
| 7,272,888 B2 | 9/2007 | DiStefano |
| 7,294,928 B2 | 11/2007 | Bang et al. |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,420,284 B2 | 9/2008 | Miyazaki et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,278 B2 | 4/2010 | Periaman et al. |
| 7,692,931 B2 | 4/2010 | Chong et al. |
| 7,763,964 B2 | 7/2010 | Matsushima |
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,795,721 B2 | 9/2010 | Kurita |
| RE41,972 E | 11/2010 | Lenander et al. |
| 7,855,445 B2 | 12/2010 | Landry et al. |
| 7,989,940 B2 | 8/2011 | Haba et al. |
| RE42,972 E | 11/2011 | Nakamura et al. |
| 8,072,037 B2 | 12/2011 | Murphy et al. |
| 8,138,015 B2 | 3/2012 | Joseph et al. |
| 8,254,155 B1 | 8/2012 | Crisp et al. |
| 8,278,764 B1 | 10/2012 | Crisp et al. |
| 8,338,963 B2 | 12/2012 | Haba et al. |
| 8,345,441 B1 | 1/2013 | Crisp et al. |
| 8,378,478 B2 | 2/2013 | Desai et al. |
| 8,405,207 B1 | 3/2013 | Crisp et al. |
| 8,426,983 B2 | 4/2013 | Takeda et al. |
| 8,432,046 B2 | 4/2013 | Miyata et al. |
| 8,436,457 B2 | 5/2013 | Crisp et al. |
| 8,436,477 B2 | 5/2013 | Crisp et al. |
| 8,441,111 B2 | 5/2013 | Crisp et al. |
| 8,502,390 B2 | 8/2013 | Crisp et al. |
| 8,513,813 B2 | 8/2013 | Crisp et al. |
| 8,513,817 B2 | 8/2013 | Haba et al. |
| 8,525,327 B2 | 9/2013 | Crisp et al. |
| 8,610,260 B2 | 12/2013 | Crisp et al. |
| 8,629,545 B2 | 1/2014 | Crisp et al. |
| 8,653,646 B2 | 2/2014 | Crisp et al. |
| 8,654,663 B2 | 2/2014 | Prasad et al. |
| 8,659,139 B2 | 2/2014 | Crisp et al. |
| 8,659,140 B2 | 2/2014 | Crisp et al. |
| 8,659,141 B2 | 2/2014 | Crisp et al. |
| 8,659,142 B2 | 2/2014 | Crisp et al. |
| 8,659,143 B2 | 2/2014 | Crisp et al. |
| 8,670,261 B2 | 3/2014 | Crisp et al. |
| 8,723,329 B1* | 5/2014 | Crisp ............... H01L 23/49827 |
| | | 257/691 |
| 8,823,165 B2 | 9/2014 | Haba et al. |
| 8,902,680 B2 | 12/2014 | Yamamoto |
| 8,917,532 B2 | 12/2014 | Crisp et al. |
| 8,981,547 B2 | 3/2015 | Crisp et al. |
| 9,432,298 B1 | 8/2016 | Smith |
| 9,484,080 B1* | 11/2016 | Sun ...................... G11C 5/063 |
| 2001/0002727 A1 | 6/2001 | Shiraishi et al. |
| 2001/0013662 A1 | 8/2001 | Kudou et al. |
| 2001/0022740 A1 | 9/2001 | Nuxoll et al. |
| 2001/0038106 A1 | 11/2001 | Coteus et al. |
| 2002/0000583 A1 | 1/2002 | Kitsukawa et al. |
| 2002/0016056 A1 | 2/2002 | Corisis |
| 2002/0027019 A1 | 3/2002 | Hashimoto |
| 2002/0030261 A1 | 3/2002 | Rolda et al. |
| 2002/0043719 A1 | 4/2002 | Iwaya et al. |
| 2002/0053727 A1 | 5/2002 | Kimura |
| 2002/0053732 A1 | 5/2002 | Iwaya et al. |
| 2002/0066950 A1 | 6/2002 | Joshi |

(56) References Cited

U.S. PATENT DOCUMENTS

| | | |
|---|---|---|
| 2002/0105096 A1 | 8/2002 | Hirata et al. |
| 2002/0130412 A1 | 9/2002 | Nagai et al. |
| 2002/0171142 A1 | 11/2002 | Kinsman |
| 2003/0064547 A1 | 4/2003 | Akram et al. |
| 2003/0089978 A1 | 5/2003 | Miyamoto et al. |
| 2003/0089982 A1 | 5/2003 | Feurle |
| 2003/0107118 A1 | 6/2003 | Pflughaupt et al. |
| 2003/0107908 A1 | 6/2003 | Jang et al. |
| 2003/0168748 A1 | 9/2003 | Katagiri et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0084538 A1 | 5/2004 | Nishizawa et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0145054 A1 | 7/2004 | Bang et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2004/0245617 A1 | 12/2004 | Damberg et al. |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1 | 4/2006 | Hsieh |
| 2006/0091518 A1 | 5/2006 | Grafe et al. |
| 2006/0170093 A1 | 8/2006 | Pendse |
| 2006/0192282 A1 | 8/2006 | Suwa et al. |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0052462 A1 | 2/2008 | Blakely et al. |
| 2008/0061423 A1 | 3/2008 | Brox et al. |
| 2008/0074930 A1 | 3/2008 | Kanda |
| 2008/0088030 A1 | 4/2008 | Eldridge et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2008/0284003 A1 | 11/2008 | Kwang et al. |
| 2009/0001574 A1 | 1/2009 | Fang et al. |
| 2009/0065948 A1 | 3/2009 | Wang |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0250255 A1 | 10/2009 | Shilling et al. |
| 2009/0250822 A1 | 10/2009 | Chen et al. |
| 2009/0273075 A1 | 11/2009 | Meyer-Berg |
| 2009/0294938 A1 | 12/2009 | Chen |
| 2009/0314538 A1 | 12/2009 | Jomaa et al. |
| 2010/0005366 A1 | 1/2010 | Dell et al. |
| 2010/0052111 A1 | 3/2010 | Urakawa |
| 2010/0090326 A1 | 4/2010 | Baek et al. |
| 2010/0102428 A1 | 4/2010 | Lee et al. |
| 2010/0148172 A1 | 6/2010 | Watanabe et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0084758 A1 | 4/2011 | Shibata et al. |
| 2011/0110165 A1 | 5/2011 | Gillingham et al. |
| 2011/0140247 A1 | 6/2011 | Pagaila et al. |
| 2011/0149493 A1 | 6/2011 | Kwon et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0153435 A1 | 6/2012 | Haba et al. |
| 2012/0155049 A1 | 6/2012 | Haba et al. |
| 2012/0203954 A1 | 8/2012 | Sun et al. |
| 2012/0206181 A1 | 8/2012 | Lin et al. |
| 2012/0217642 A1 | 8/2012 | Sun et al. |
| 2012/0217645 A1 | 8/2012 | Pagaila |
| 2012/0271990 A1 | 10/2012 | Chen et al. |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0009318 A1 | 1/2013 | Chia et al. |
| 2013/0015590 A1 | 1/2013 | Haba et al. |
| 2013/0082394 A1 | 4/2013 | Crisp et al. |
| 2013/0083583 A1 | 4/2013 | Crisp et al. |
| 2013/0168843 A1 | 7/2013 | Zohni |
| 2013/0286707 A1 | 10/2013 | Crisp et al. |
| 2013/0307138 A1 | 11/2013 | Crisp et al. |
| 2014/0042644 A1 | 2/2014 | Haba et al. |
| 2014/0055941 A1 | 2/2014 | Crisp et al. |
| 2014/0055942 A1 | 2/2014 | Crisp et al. |
| 2014/0055970 A1 | 2/2014 | Crisp et al. |
| 2014/0362629 A1 | 12/2014 | Crisp et al. |
| 2015/0043295 A1 | 2/2015 | Kim et al. |
| 2015/0048521 A1 | 2/2015 | Kwon et al. |
| 2016/0035703 A1* | 2/2016 | Sun .................. H01L 24/49 257/777 |

FOREIGN PATENT DOCUMENTS

| | | |
|---|---|---|
| EP | 1205977 A2 | 5/2002 |
| JP | 61-093694 | 5/1986 |
| JP | 63-232389 | 9/1988 |
| JP | 64-001257 A | 1/1989 |
| JP | H11-087640 | 3/1999 |
| JP | 2000196008 A | 7/2000 |
| JP | 200315776 A | 11/2000 |
| JP | 2002076252 A | 3/2002 |
| JP | 2002083897 A | 3/2002 |
| JP | 2003051545 A | 2/2003 |
| JP | 200063767 A | 2/2004 |
| JP | 2004063767 A | 2/2004 |
| JP | 2004152131 A | 5/2004 |
| JP | 2005340724 A | 12/2005 |
| JP | 2006310411 A | 11/2006 |
| JP | 2007013146 A | 1/2007 |
| JP | 2007149977 A | 6/2007 |
| JP | 2008016666 A | 1/2008 |
| JP | 2008135597 A | 6/2008 |
| JP | 3143893 U | 8/2008 |
| JP | 2008198841 A | 8/2008 |
| JP | 2009182163 A | 8/2009 |
| JP | 2010098098 A | 4/2010 |
| JP | 2010282510 A | 12/2010 |
| JP | 2011096268 A | 5/2011 |
| JP | 2011155203 A | 8/2011 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |
| KR | 2009-0086314 A | 8/2009 |
| TW | 312044 | 8/1997 |
| TW | 428258 | 4/2001 |
| TW | 429561 | 4/2001 |

(56) References Cited

FOREIGN PATENT DOCUMENTS

| TW | 478137 B | 3/2002 |
|---|---|---|
| TW | 567593 B | 12/2003 |
| TW | M338433 U | 8/2008 |
| TW | 200842998 A | 11/2008 |
| TW | 200901194 A | 1/2009 |
| TW | 200926312 A | 6/2009 |
| TW | M363079 U | 8/2009 |
| TW | M398313 | 2/2011 |
| TW | 201115659 A | 5/2011 |
| TW | 201208004 | 2/2012 |
| TW | M426922 U | 4/2012 |
| TW | 201222684 | 6/2012 |
| TW | 201234556 A | 8/2012 |
| WO | 2010120310 A1 | 10/2010 |

OTHER PUBLICATIONS

International Search Report and Written Opinion dated Mar. 21, 2013 for Application No. PCT/US2012/057911.
International Search Report and Written Opinion for Application No. PCT/US2012/046255 dated Mar. 20, 2013.
International Search Report and Written Opinion dated Mar. 21, 2013 for Application No. PCT/US2012/000425.
International Search Report and Written Opinion for Application No. PCT/US2012/058407 dated Mar. 28, 2013.
International Search Report and Written Opinion for Application No. PCT/US2012/057179 dated Apr. 4, 2013.
International Search Report and Written Opinion for Application No. PCT/US2012/057895 dated Jun. 10, 2013.
International Search Report and Written Opinion for Application No. PCT/US2012/058434 dated Jun. 21, 2013.
International Search Report and Written Opinion for Application No. PCT/US2012/058398 dated Jul. 4, 2013.
International Search Report and Written Opinion for Application No. PCT/US2012/058229 dated Jul. 3, 2013.
International Search Report and Written Opinion for Application No. PCT/US2012/057810 dated Jul. 23, 2013.
International Search Report for Application No. PCT/US2012/057173 dated Aug. 5, 2013.
International Search Report for Application No. PCT/US2012/057905 dated Aug. 20, 2013.
International Search Report and Written Opinion for Application No. PCT/US2012/057204 dated Aug. 30, 2013.
International Search Report and Written Opinion for Application No. PCT/US2013/056773 dated Dec. 4, 2013.
International Search Report and Written Opinion for Application PCT/US2013/056777 dated Jan. 2, 2014.
U.S. Appl. No. 13/839,402, filed Mar. 15, 2013.
U.S. Appl. No. 13/841,052, filed Mar. 15, 2013.
U.S. Appl. No. 13/840,542, filed Mar. 15, 2013.
U.S. Appl. No. 13/840,353, filed Mar. 15, 2013.
U.S. Appl. No. 61/477,877, filed on Apr. 21, 2011.
Office Action from Taiwan for Application No. 101125197 dated May 19, 2014.
Taiwanese Allowance and Search Report for Application No. 101136592 dated Jun. 27, 2014.
Taiwanese Office Action for Application No. 101136594 dated Aug. 13, 2014.
Taiwanese Office Action for Application No. 101136595 dated Oct. 27, 2014.
International Search Report and Written Opinion for Application No. PCT/US2014/041709 dated Nov. 4, 2014.
Taiwanese Office Action for Application No. 101136575 dated Oct. 28, 2014.
International Search Report and Written Opinion for Application No. PCT/US2013/056777 dated Jan. 21, 2015.
Taiwanese Office Action for Application No. 101136585 dated Jan. 21, 2015.
Taiwanese Notice of Allowance for Application No. 102130518 dated Mar. 31, 2015.
Taiwanese Office Action for Application No. 101136606 dated Mar. 27, 2015.
Taiwanese Office Action for Application No. 101136578 dated May 12, 2015.
Taiwanese Office Action for Application No. 101136577 dated May 12, 2015.
Taiwanese Office Action for Application No. 102130519 dated May 7, 2015.
Written Opinion of the International Preliminary Examining Authority for Application No. PCT/US2014/041709 dated Jun. 1, 2015.
Taiwanese Office Action for Application No. 101125193 dated Aug. 4, 2015.
International Search Report and Written Opinion for Application No. PCT/US2015/042726 dated Nov. 12, 2015.
Chinese Office Action for Application No. 201280044482.X dated Jan. 25, 2016.
Chinese Office Action for Application No. 201280044481.5 dated Dec. 25, 2015.
Chinese Office Action for Application No. CN201280043482.8 dated Jan. 19, 2016.
Kang, et al. 8Gb 3D DDR3 DRAM Using Through-Silicon-Via Technology, IEEE, International Solid-State Circuits Conference, 2009, Samsung Electronics, Hwasung, Korea.
U.S. Appl. No. 13/306,300, filed Nov. 29, 2011.
U.S. Appl. No. 13/346,201, filed Jan. 9, 2012.
U.S. Appl. No. 13/080,876, filed Apr. 6, 2011.
U.S. Appl. No. 13/306,068, filed Nov. 29, 2011.
U.S. Appl. No. 13/346,185, filed Jan. 9, 2012.
U.S. Appl. No. 13/337,565, filed Dec. 27, 2011.
U.S. Appl. No. 13/440,313, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/439,286, filed Apr. 5, 2012.
U.S. Appl. No. 13/354,747, filed Jan. 20, 2012.
U.S. Appl. No. 13/354,772, filed Jan. 20, 2012.
Kang, et al., 8Gb 3D DDR3 DRAM Using Through-Silicon-Via Technology, IEEE, International Solid-State Circuits Conference, 2009, pp. 130-132.
U.S. Appl. No. 13/337,575, filed Dec. 27, 2011.
U.S. Appl. No. 13/440,515, filed Apr. 5, 2012.
Sandforce, "SF-2200 & SF-2100 Client SSD Processors", 2011.
U.S. Appl. No. 13/439,299, filed Apr. 4, 2012.
U.S. Appl. No. 13/439,354, filed Apr. 4, 2012.
U.S. Appl. No. 13/439,273, filed Apr. 4, 2012.
U.S. Appl. No. 13/439,228, filed Apr. 4, 2012.
U.S. Appl. No. 13/440,299, filed Apr. 5, 2012.
U.S. Appl. No. 13/440,290, filed Apr. 5, 2012.
U.S. Appl. No. 13/440,199, filed Apr. 5, 2012.
U.S. Appl. No. 13/440,280, filed Apr. 5, 2012.
Elpida User's Manual, "Introduction to GDDR5 SGRAM", Document No. E1600E10 (Ver. 1.0), Published Mar. 2010, Japan, URL: http:'www.elpida.com.
Hynix, "2GB (64Mx32) GDDR5 SGRAM HRGQ2H24AFR", Nov. 2011-Feb. 2012.
Partial International Search Report dated Oct. 26, 2012 in International Patent Appl. No. PCT/US2012/046049.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
US Non-Final Office Action for U.S. Appl. No. 13/440,199 dated Aug. 31, 2012.
US Non-Final Office Action for U.S. Appl. No. 13/440,280 dated Aug. 31, 2012.
US Amendment for U.S. Appl. No. 13/440,280 dated Nov. 30, 2012.
US Amendment for U.S. Appl. No. 13/440,199 dated Nov. 30, 2012.
US Non Final Office Action dated Oct. 18, 2012 for U.S. Appl. No. 13/439,299.
International Search Report and Written Opinion for Application No. PCT/US2012/046049 dated Jan. 10, 2013.

(56) References Cited

OTHER PUBLICATIONS

International Search Report and Written Opinion for Application No. PCT/US2012/046049 dated Nov. 29, 2012.
US Amendment for U.S. Appl. No. 13/439,299 dated Jan. 18, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/057170 dated Jan. 31, 2013.
Partial Search Report for Application No. PCT/US2012/000425 dated Jan. 30, 2013.
Partial Search Report for Application No. PCT/US2012/058557 dated Feb. 4, 2013.
International Search Report and Written Opinion for Application No. PCT/US2012/057563 dated Mar. 5, 2013.
International Search Report and Written Opinion for Application No. PCT/US2012/057554 dated Feb. 28, 2013.
International Search Report and Written Opinion for Application No. PCT/US2012/057200 dated Mar. 1, 2013.
International Search Report and Written Opinion for Application No. PCT/US2012/058273 dated Mar. 6, 2013.
International Search Report and Written Opinion for Application No. PCT/US2012/058557 dated Mar. 12, 2013.
International Search Report and Written Opinion for Application No. PCT/US2012/046249 dated Mar. 20, 2013.
International Search Report and Written Opinion for Application No. PCT/US2012/057170 dated Mar. 22, 2013.

* cited by examiner

TFD I/O PARTITION FOR HIGH-SPEED, HIGH-DENSITY APPLICATIONS

BACKGROUND OF THE INVENTION

The subject matter of the present application relates to microelectronic packages, circuit panels, and microelectronic assemblies incorporating one or more microelectronic package and a circuit panel.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory, and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device.

Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips, are commonly packaged in single- or multiple-chip packages and assemblies. Each package has many electrical connections for carrying signals, power, and ground between terminals and the chips therein. The electrical connections can include different kinds of conductors such as horizontal conductors, e.g., traces, beam leads, etc., that extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or may include a DRAM chip, or a stacked electrically interconnected assembly of such semiconductor chips.

In light of the foregoing, certain improvements in the design of microelectronic packages and microelectronic assemblies including circuit panels and/or other microelectronic components can be made in order to improve the functional flexibility or electrical performance thereof, particularly in microelectronic packages and microelectronic assemblies having circuit panels and/or other microelectronic components to which microelectronic packages can be mounted and electrically interconnected with one another.

BRIEF SUMMARY OF THE INVENTION

A microelectronic package can include, a substrate having first and second opposed surfaces, first, second, and third microelectronic elements each having a surface facing the first surface of the substrate, terminals exposed at the second surface and configured for connecting the microelectronic package to at least one component external to the microelectronic package, and leads electrically connected between contacts of each microelectronic element and the terminals. The substrate can have first and second opposed edges extending between the first and second surfaces, and first, second, and third spaced-apart apertures each extending between the first and second surfaces. The apertures can have first, second, and third parallel axes each extending in directions of the lengths of the apertures, respectively. The third axis can be disposed between the first and second axes. The second surface can have a central region between the first and second axes.

The first, second, and third microelectronic elements can each have contacts exposed at the surface of the respective microelectronic element and aligned with one of the first, second, or third apertures, respectively. Each microelectronic element can have memory storage array function. Each lead can have a portion aligned with at least one of the apertures. The terminals can include first terminals configured to carry address information. The first terminals can include first and second sets thereof. The first set of the first terminals can be electrically connected with the first and third microelectronic elements and not electrically connected with the second microelectronic element. The second set of the first terminals can be electrically connected with the second microelectronic element and not electrically connected with the first or third microelectronic elements.

In one embodiment, the terminals can include second terminals configured to carry second information. The second information can be other than the information carried by the first terminals. The second information can include data signals. The second terminals can include first, second, and third sets thereof each connected to only one of the first, second, and third microelectronic elements. In a particular example, the third set of the second terminals can be electrically connected with the third microelectronic element. The third set of the second terminals can include first and second groups disposed in the central region on first and second opposite sides of the third aperture. In an exemplary embodiment, the second surface of the substrate can have first and second peripheral regions between the central region and the respective first and second edges. The first and second sets of second terminals can be electrically connected with the respective first and second microelectronic elements and can be disposed in the respective first and second peripheral regions.

In one example, the signal assignments of corresponding ones of the second terminals in the first and second sets can be symmetric about a theoretical fourth axis between the first and second sets. The fourth axis can be parallel to the first, second, and third axes. In a particular embodiment, the fourth axis can be located within one ball pitch of the terminals of a centerline of the substrate located equidistant between the first and second opposed edges. In one embodiment, the first and second sets of the second terminals can be disposed at positions within respective first and second grids, and columns of the second terminals in the first and second grids can extend in a direction parallel to the first and second opposed edges of the substrate. In a particular example, the first terminals can be configured to carry all of the address information usable by circuitry within the microelectronic package. In an exemplary embodiment, the first set of first terminals and the second set of first terminals can each be configured to carry all of the same signals.

In one example, the signal assignments of corresponding ones of the first terminals in the first and second sets can be symmetric about a theoretical fourth axis between the first and second sets. The fourth axis can be parallel to the first, second, and third axes. In a particular embodiment, the fourth axis can be located within one ball pitch of the terminals of a centerline of the substrate located equidistant between the first and second opposed edges. In one embodiment, the first and second sets of the first terminals can be disposed at positions within respective first and second grids, and columns of the first terminals in the first and second grids can extend in a direction parallel to the first and second opposed edges of the substrate. In a particular example, each of the microelectronic elements can embody a greater number of active devices to provide memory storage array function than any other function.

In an exemplary embodiment, the surface of each of the first and second microelectronic elements can confront the first surface of the substrate, and the surface of the third microelectronic element can at least partially overlie a rear surface of at least one of the first and second microelectronic elements. In one example, the surfaces of all of the microelectronic elements can be arranged in a single plane parallel to the first surface of the substrate. In a particular embodiment, at least some of the leads can include wire bonds extending through at least one of the apertures. In one embodiment, a system can include a microelectronic package as described above and one or more other electronic components electrically connected to the microelectronic package. In a particular example, the system can also include a housing, the microelectronic package and the one or more other electronic components being assembled with the housing.

A microelectronic assembly can include a circuit panel having first and second opposed surfaces and an address bus comprising a plurality of signal conductors electrically connected with a plurality of mutually exclusive connection regions. Each connection region can include first panel contacts and second panel contacts electrically coupled with the first panel contacts disposed at the first and second surfaces, respectively. The microelectronic assembly can also include first and second microelectronic packages having first terminals mounted to the first panel contacts and the second panel contacts, respectively. Each microelectronic package can have first, second, and third microelectronic elements therein.

Each microelectronic element may be electrically coupled to the address bus via only one of the connection regions. The first and third microelectronic elements of the first microelectronic package and the second microelectronic element of the second microelectronic package may be electrically coupled to the address bus only at a first one of the connection regions. The second microelectronic elements of the first microelectronic package and the first and third microelectronic elements of the second microelectronic package may be electrically coupled to the address bus only at a second one of the connection regions.

In one embodiment, the address bus can be configured to carry all address signals usable by circuitry within the first and second microelectronic packages. In a particular example, each of the microelectronic elements can embody a greater number of active devices to provide memory storage array function than any other function. In an exemplary embodiment, the first terminals of the first and second microelectronic packages can be arranged at positions of first and second grids, and the first and second grids can be aligned with one another in x and y orthogonal directions parallel to the first and second surfaces of the circuit panel. The alignment can be within a distance equal to a minimum pitch between adjacent terminals of the grids.

In one example, the microelectronic assembly can also include third and fourth microelectronic packages having first terminals mounted to the first panel contacts and the second panel contacts, respectively. Each of the third and fourth microelectronic packages can have first, second, and third microelectronic elements therein. Each microelectronic element can be electrically coupled to the address bus via only one of the connection regions. The first and third microelectronic elements of the third microelectronic package and the second microelectronic element of the fourth microelectronic package can be electrically coupled to the address bus only at a third one of the connection regions. The second microelectronic element of the third microelectronic package and the first and third microelectronic elements of the fourth microelectronic package can be electrically coupled to the address bus only at a fourth one of the connection regions.

An electrical characteristic between the first and second connection regions can be within a same tolerance of the electrical characteristic between the second and third connection regions. In a particular embodiment, the electrical characteristic can be an electrical trace length. In one embodiment, the electrical characteristic can be an electrical propagation delay. In a particular example, the electrical characteristic can be a characteristic impedance of the signal conductors. In an exemplary embodiment, the electrical characteristic can be a difference in an electrical load applied to the address bus from the microelectronic elements connected with the respective connection region.

A microelectronic assembly can include a circuit panel having first and second opposed surfaces and an address bus comprising a plurality of signal conductors electrically connected with a plurality of mutually exclusive connection regions. Each connection region can include either or both of first panel contacts and second panel contacts electrically coupled with at least some of the plurality of signal conductors and disposed at the first and second surfaces, respectively. The microelectronic assembly can also include first and second microelectronic packages having first terminals mounted to the first panel contacts and the second panel contacts, respectively. Each microelectronic package can have first, second, and third microelectronic elements therein.

Each microelectronic element may be electrically coupled to the address bus via only one of the connection regions. The first and third microelectronic elements of the first microelectronic package may be electrically coupled to the address bus only at a first one of the connection regions. The second microelectronic element of the first microelectronic package and the second microelectronic element of the second microelectronic package may be electrically coupled to the address bus only at a second one of the connection regions. The first and third microelectronic elements of the second microelectronic package may be electrically coupled to the address bus only at a third one of the connection regions.

In one embodiment, the address bus can be configured to carry all address signals usable by circuitry within the first and second microelectronic packages. In a particular example, each of the microelectronic elements can embody a greater number of active devices to provide memory storage array function than any other function. In an exemplary embodiment, an electrical characteristic between the first and second connection regions can be within a same tolerance of the electrical characteristic between the second and third connection regions. In one example, the electrical characteristic can be an electrical trace length. In a particular embodiment, the electrical characteristic can be an electrical propagation delay. In one embodiment, the electrical characteristic can be a characteristic impedance of the signal conductors. In a particular example, the electrical characteristic can be a difference in an electrical load applied to the address bus from the microelectronic elements connected with the respective connection region.

In an exemplary embodiment, the microelectronic assembly can also include third and fourth microelectronic packages having first terminals mounted to the first panel contacts and the second panel contacts, respectively. Each of the third and fourth microelectronic packages can have first, second, and third microelectronic elements therein. Each microelectronic element can be electrically coupled to the address bus via only one of the connection regions. The first and third microelectronic elements of the third microelectronic package can be electrically coupled to the address bus only at a fourth one of the connection regions. The second microelectronic element of the third microelectronic package and the second microelectronic element of the fourth microelectronic package can be electrically coupled to the address bus only at a fifth one of the connection regions. The first and third microelectronic elements of the fourth microelectronic package may not be electrically coupled to the address bus. In one example, the first and third microelectronic elements of the fourth microelectronic package can be electrically coupled to third panel contacts disposed at the second surface of the circuit panel, and the third panel contacts may not be connected in any electrical path to the address bus within the microelectronic assembly.

DETAILED DESCRIPTION

Figure 1A:
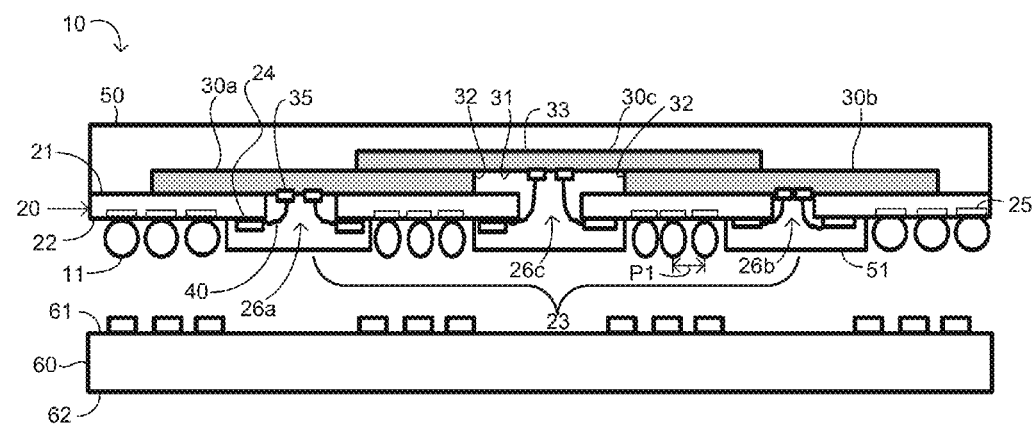
FIG. 1A is a sectional view of a microelectronic assembly including a microelectronic package and a circuit panel according to an embodiment of the present invention.
Figure 1B:
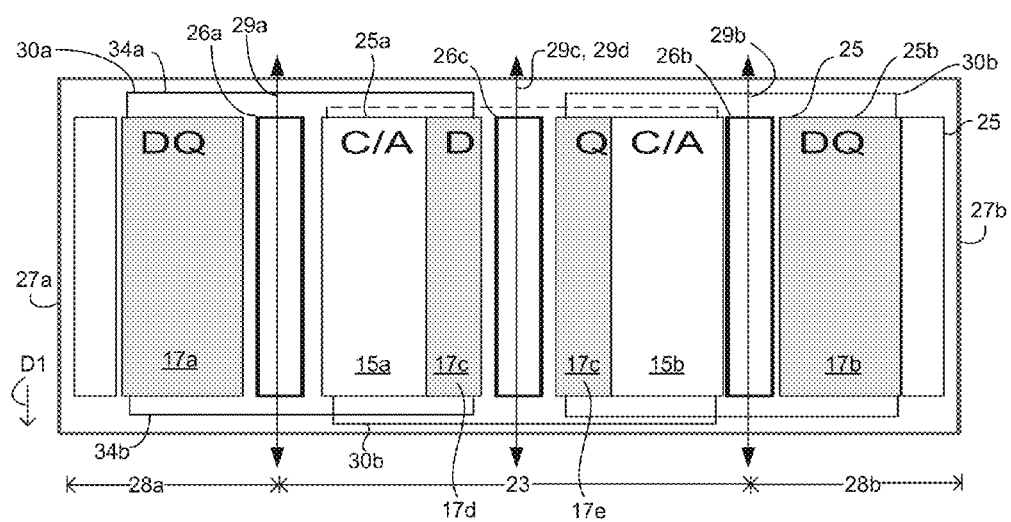
FIG. 1B is a diagrammatic plan view of the microelectronic package shown in FIG. 1A.

FIGS. 1A and 1B illustrate a particular type of microelectronic package 10. As seen in FIGS. 1A and 1B, the microelectronic package 10 can include packaging structure, for example, a dielectric element or substrate 20, e.g., a support element that includes or consists essentially of dielectric material, e.g., organic or inorganic dielectric material such as, without limitation, oxides, nitrides, or combinations thereof, epoxies, polyimides, thermoset materials or thermoplastics, or other polymeric materials, or composite materials such as epoxy-glass, which can be FR-4 or BT resin structures, or which can be a portion of a tape utilized in tape-automated bonding ("TAB"), for example. The dielectric element 20 has first and second oppositely facing surfaces 21 and 22.

In some cases, the dielectric element 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the dielectric element, i.e., in a direction along its surface.

In FIGS. 1A and 1B, the directions parallel to the first surface 21 of the dielectric element 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

First, second, and third apertures 26a, 26b, and 26c can extend between the first and second surfaces 21, 22 of the dielectric element 20. As can be seen in FIG. 1A, the dielectric element 20 can have two three apertures 26a, 26b, and 26c extending therethrough. The longest dimensions of the apertures 26a, 26b, and 26c can define first, second, and third parallel axes 29a, 29b, and 29c (collectively axes 29). The first and second parallel axes 29a and 29b can define a central region 23 of the second surface 22 of the dielectric element 20 located between the axes 29a and 29b. A first peripheral region 28a of the second surface is disposed between axis 29a and the peripheral edge 27a of the dielectric element. A second peripheral region 28b of the second surface is disposed between axis 29b and a peripheral edge 27b of the dielectric element opposite from peripheral edge 27a. Hereinafter, a statement that a terminal is disposed between an aperture of a substrate and a given feature of a substrate or package such as a peripheral edge thereof shall mean that the terminal is disposed between an axis of the aperture and the given feature.

The dielectric element 20 can have a plurality of terminals 25, e.g., conductive pads, lands, or conductive posts at the second surface 22 of the dielectric element 20. As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

The terminals 25 can be configured for connecting the microelectronic package 10 to at least one component external to the microelectronic package. The terminals 25 can function as endpoints for the connection of the microelectronic package 10 with corresponding electrically conductive elements of an external component such as the contacts of a circuit panel 60, e.g., printed wiring board, flexible circuit panel, socket, other microelectronic assembly or package, interposer, or passive component assembly, among others. In one example, such a circuit panel can be a motherboard or DIMM module board. In a particular example, the circuit panel 60 can include an element having a CTE less than 30 ppm/° C. In one embodiment, such an element can consist essentially of semiconductor, glass, ceramic or liquid crystal polymer material.

In one example, terminals 25a that are disposed in the central region 23 of the second surface 22 of the dielectric element 20 can be configured to carry address signals. These terminals are referred to herein as "first terminals." The first terminals 25a comprise terminals configured to carry address information. For example, when the microelectronic elements 30a, 30b, 30c include or are DRAM semiconductor chips, each set 15a, 15b of first terminals 25a can be configured to carry sufficient address information transferred to the microelectronic package 10 that is usable by circuitry within the package, e.g., row address and column address decoders, and bank selection circuitry of one or more of the microelectronic elements 30 to determine an addressable memory location from among all the available addressable memory locations of a memory storage array within a microelectronic element in the package. In a particular embodiment, the first terminals 25a can be configured to carry all the address information used by such circuitry within the microelectronic package 10 to determine an addressable memory location within such memory storage array. In one example, the first terminals 25a can be configured to carry all of the address information usable by circuitry within the microelectronic package 10.

In one example, the first terminals 25a can be configured to carry each of a group of signals of a command-address bus of the microelectronic element; i.e., command signals, address signals, bank address signals, and clock signals that are transferred to the microelectronic package, wherein the command signals include write enable, row address strobe, and column address strobe signals, and the clock signals are clocks used for sampling the address signals. While the clock signals can be of various types, in one embodiment, the clock signals carried by these terminals can be one or more pairs of differential clock signals received as differential or true and complement clock signals.

In a particular example in which the microelectronic elements 30a, 30b, and 30c include DDR3 type chips, the command signals transferred to the microelectronic elements can include write enable ("WE"), row address strobe ("RAS"), and column address strobe signals ("CAS"). In one example in which the microelectronic elements 30a, 30b, and 30c include DDR4 type chips, the command signals transferred to the microelectronic elements can include write enable, row address strobe, column address strobe, activate ("ACT"), and parity ("PAR") signals. Such contacts and/or terminals in packages containing DDR3 or DDR4 chips that are configured to receive the aforementioned command signals can be included in any of the embodiments described herein.

In a particular embodiment, the first set 15a of first terminals 25a can be configured to carry all the address information used by the circuitry within the microelectronic package 10 to determine an addressable memory location within the first and third microelectronic elements 30a, 30c and the second set 15b of first terminals 25a can be configured to carry all the address information used by the circuitry within the microelectronic package 10 to determine an addressable memory location within the second microelectronic element 30b. In one example, each set 15a, 15b of first terminals 125a can be configured to carry each of a group of signals of a command-address bus of the corresponding microelectronic elements; i.e., command signals, address signals, bank address signals, and clock signals that are transferred to the microelectronic package 10. In some examples (e.g., FIGS. 1F and 1G), the first set 15a of first terminals 25a and the second set 15b of first terminals can each be configured to carry all of the same signals (e.g., having the same numerical weight).

Figure 1C:
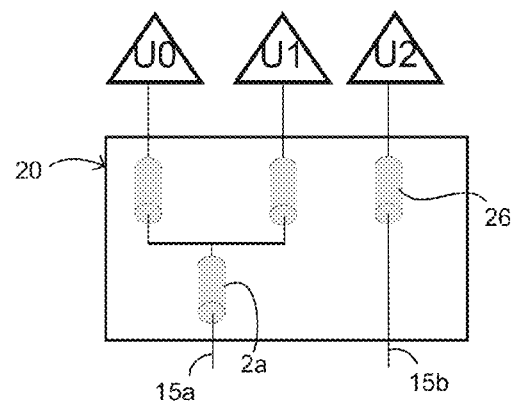
FIG. 1C is a diagrammatic representation of the electrical connections for address signals within the microelectronic package shown in FIG. 1A.
Figure 1D:
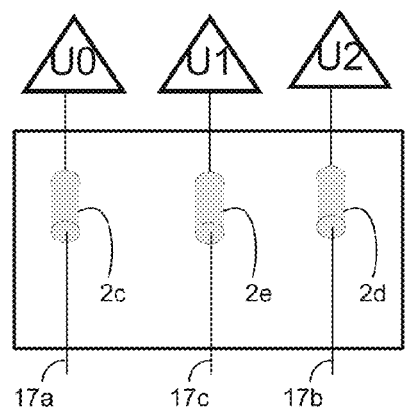
FIG. 1D is a diagrammatic representation of the electrical connections for data signals within the microelectronic package shown in FIG. 1A.
Figure 1E:
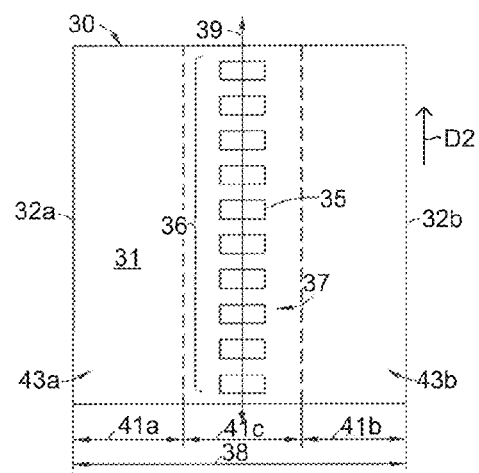
FIG. 1E is a diagrammatic plan view a microelectronic element suitable for use in the microelectronic package shown in FIG. 1A.
Figure 1F:
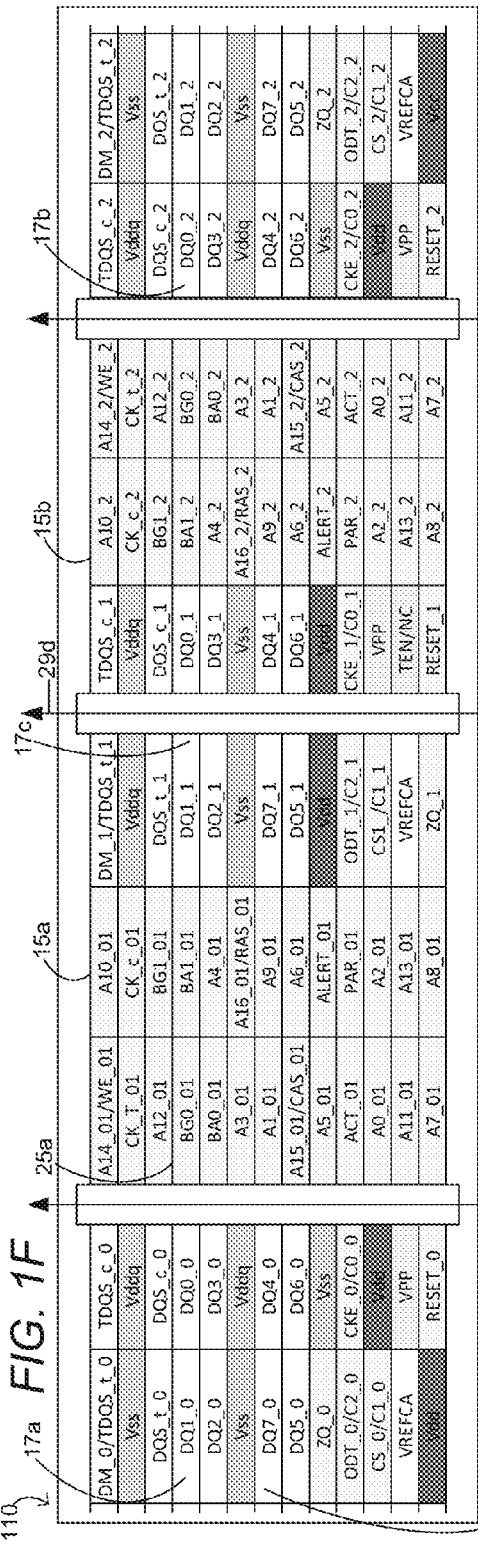
FIG. 1F is a diagrammatic plan view showing potential signal assignments of a portion of the diagrammatic plan view shown in FIG. 1B, according to one embodiment.
Figure 1G:
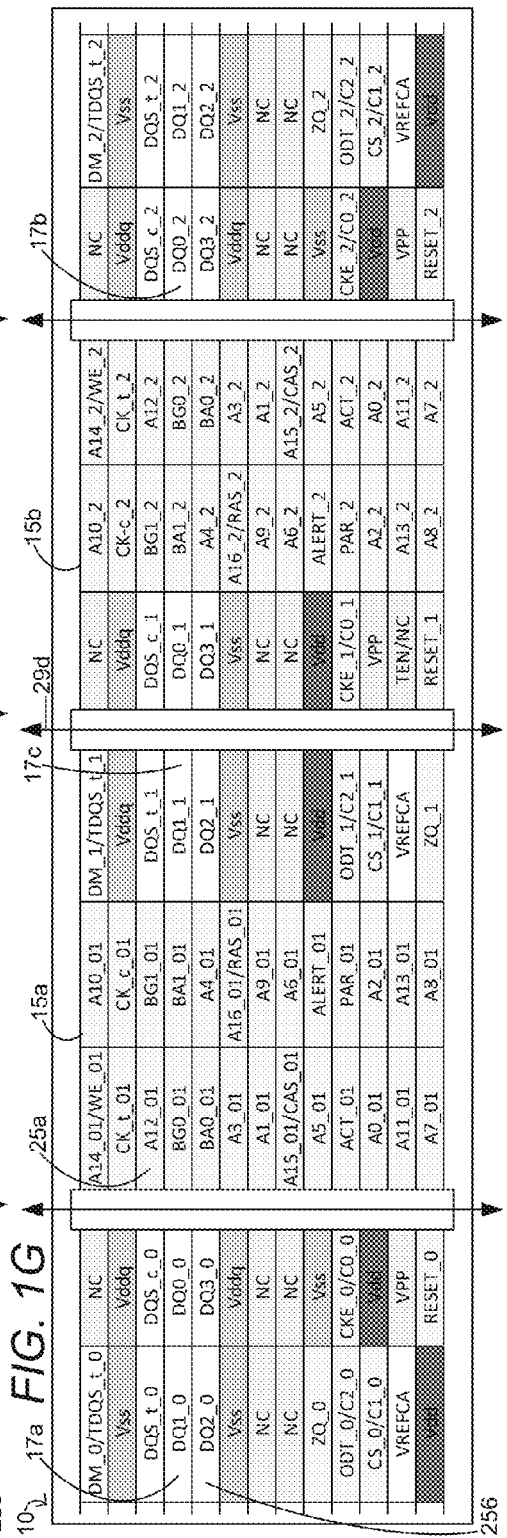
FIG. 1G is a diagrammatic plan view showing potential signal assignments of a portion of the diagrammatic plan view shown in FIG. 1B, according to another embodiment.

In one example, as can also be seen in FIGS. 1F and 1G, the signal assignments of corresponding ones of the first terminals 25a in the first and second sets 15a, 15b can be symmetric about a theoretical fourth axis 29d between the first and second sets, the fourth axis being parallel to the first, second, and third axes 29a, 29b, 29c. In one embodiment, such a fourth axis 29d can be located within one ball pitch of the terminals of a centerline of the substrate 20 located equidistant between the first and second opposed edges 27a, 27b. As shown in FIGS. 1B, 1F, and 1G, the first and second sets 15a, 15b of the first terminals 25b can be disposed at positions within respective first and second grids, and columns of the first terminals in the first and second grids can extend in a direction D1 parallel to the first and second opposed edges 27a, 27b of the substrate 20.

As further seen in FIG. 1B, in addition to first terminals 25a, second terminals 25b can be disposed at the second surface 22 of the substrate 20. As can be seen in FIG. 1B, a first set 17a of the second terminals 25b can be disposed in the first peripheral region 28a of the second surface 22 of the substrate 20, a second set 17b of the second terminals 25b can be disposed in the second peripheral region 28b of the second surface of the substrate, and a third set 17c of the second terminals 25b can be disposed in the central region 23 of the second surface of the substrate.

In one example, as can be seen in FIG. 1D, each of the memory arrays U0, U1, U2 of the microelectronic elements 30a, 30b, 30c can have an independent electrical connection 2c, 2d, 2e to a corresponding first, second, or third set 17a, 17b, 17c of second terminals 25b, respectively. Stated another way, in the microelectronic package 10, the first, second, and third sets 17a, 17b, 17c of second terminals 25b are each connected to only one of the first, second, and third microelectronic elements 30a, 30b, 30c, respectively.

In one embodiment, the first and second sets 17a, 17b of second terminals 25b can be electrically connected with the respective first and second microelectronic elements 30a, 30b, and can be disposed in the respective first and second peripheral regions 28a, 28b. In one example, the third set 17c of the second terminals 25b can be electrically connected with the third microelectronic element 30c, and the third set of second terminals can include first and second groups 17d and 17e disposed in the central region 23 of the second surface 22 of the substrate 20 on first and second opposite sides of the third aperture 26c.

In one example, as can also be seen in FIGS. 1F and 1G, the signal assignments of corresponding ones of the second terminals 25b in the first and second sets 17a, 17b can be symmetric about a theoretical fourth axis 29d between the first and second sets, the fourth axis being parallel to the first, second, and third axes 29a, 29b, 29c. In one embodiment, such a fourth axis 29d can be located within one ball pitch of the terminals of a centerline of the substrate 20 located equidistant between the first and second opposed edges 27a, 27b. As shown in FIGS. 1B, 1F, and 1G, the first and second sets 17a, 17b of the second terminals 25b can be disposed at positions within respective first and second grids, and columns of the second terminals in the first and second grids extend in a direction D1 parallel to the first and second opposed edges 27a, 27b of the substrate 20.

Typically, the second terminals are configured to carry all bi-directional data signals for writing of data to and for reading of data from random access addressable locations of at least a main memory storage array within each DRAM microelectronic element. However, in some cases, some of the second terminals can carry uni-directional data signals for input to a microelectronic element for writing of data to a memory storage array, and some of the first terminals can carry uni-directional data signals output from a microelectronic element based on data read from a memory storage array.

In one example, the second terminals 25b can be configured to carry one or more of data strobe signals, or other signals or reference potentials such as chip select, reset, power supply voltages, e.g., Vdd, Vddq, and ground, e.g., Vss and Vssq. The second terminals 25b may include terminals assigned to carry data signals and also data masks and "on die termination" (ODT) signals used to turn on or off parallel terminations to termination resistors.

The microelectronic package 10 can include joining elements 11 attached to the terminals 25 for connection with an external component. The joining elements 11 can be, for example, masses of a bond metal such as solder, tin, indium, a eutectic composition or combination thereof, or another joining material such as an electrically conductive paste, an electrically conductive adhesive or electrically conductive matrix material or a combination of any or all of such bond metals or electrically conductive materials. In a particular embodiment, the joints between the terminals 25 and contacts of an external component (e.g., the circuit panel 60) can include an electrically conductive matrix material such as described in U.S. Pat. Nos. 8,890,304 and 9,117,811, the disclosures of which are hereby incorporated herein by reference. In a particular embodiment, the joints can have a similar structure or be formed in a manner as described therein.

The microelectronic package 10 can comprise a plurality of microelectronic elements 30 (e.g., 30a, 30b, and 30c) each having a front face 31 facing the first surface 21 of the dielectric element 20. Although the microelectronic elements 30 are shown in FIG. 1B as being offset from one another in a direction parallel to the axes 29, that need not be the case. Such an offset of the microelectronic elements 30 is shown in the figures for improved clarity of the overlying location of the microelectronic elements with respect to one another. In a particular embodiment, peripheral edges 34a of each of the microelectronic elements 30 can lie in a first common plane, and peripheral edges 34b opposite the peripheral edges 34a of each of the microelectronic elements can lie in a second common plane.

The front surfaces 31 of the first and second microelectronic elements 30a, 30b can confront the first surface 21 of the substrate 20, and the front surface of the third microelectronic element 30c can at least partially overlie a rear surface 33 of at least one of the first and second microelectronic elements. In the example shown in FIG. 1A, the front surface 31 of the third microelectronic element 30c at least partially overlies the rear surface 33 of each of the first and second microelectronic elements 30a, 30b. At least a portion of the central region 37 (FIG. 1E) of the front surface 31 of the third microelectronic element 30c can project beyond a lateral edge 32 of each of the first and second microelectronic elements 30a, 30b. Accordingly, the contacts 35 of the third microelectronic element 30c can be positioned in a location projecting beyond the lateral edge 32 of each of the first and second microelectronic elements 30a, 30b. In other examples (e.g., FIG. 1H), the front surfaces 31 of all of the microelectronic elements 30a, 30b, 30c can be arranged in a single plane parallel to the first surface 21 of the substrate 20.

One or more adhesive layers can be positioned between the front surface 31 of the first microelectronic element 30a and the first surface 21 of the dielectric element 20, between the front surface of the second microelectronic element 30b and the first surface of the dielectric element, and/or between the front surface of the third microelectronic element 30c and the rear surface 33 of one or both of the first and second microelectronic elements.

In one example, the microelectronic elements 30 can each comprise a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface. In one example, each of the microelectronic elements 30 can have memory storage array function. In a particular embodiment, each microelectronic element 30 can embody a greater number of active devices to provide memory storage array function than any other function.

As further seen in FIG. 1E, each microelectronic element 30 can have a plurality of electrically conductive element contacts 35 exposed at the front surface 31 thereof. The contacts 35 of each microelectronic element 30 can be arranged in one (e.g., FIG. 1E) or in two or more (e.g., FIG. 1A) columns 36 disposed in a central region 37 of the front face 31 that occupies a central portion of an area of the front face. As used herein with respect to a face (e.g., a front face, a rear face) of a microelectronic element, "central region" means an area, such as region 37, occupying a middle third 41c of a distance 38 between opposite peripheral edges 32a, 32b of the microelectronic element 30 in a direction orthogonal to the edges 32a, 32b.

The central region 37 is disposed between peripheral regions 43a, and 43b, each of which lies between the central region 37 and a respective peripheral edge 32a or 32b, and each peripheral region also occupying an area covering a respective third 41a or 41b of the distance 38 between the opposite peripheral edges 32a, 32b. In the particular example shown in FIG. 1E, when the contacts 35 of each microelectronic element 30 are arranged in a central region 37 of the microelectronic element, the contacts can be arranged along an axis 39 that bisects the microelectronic element. As shown in FIG. 1A, the contacts 35 of each microelectronic element 30 can be aligned with at least one of the apertures 26. In one example, the contacts of microelectronic element 30a can be aligned only with one of the apertures 26a, the contacts of microelectronic element 30b can be aligned only with another one of the apertures 26b, and the contacts of microelectronic element 30c can be aligned only with yet another one of the apertures 26c.

The microelectronic elements 30 in a microelectronic package 10 can be configured in accordance with one of several different standards, e.g., standards of JEDEC, which specify the type of signaling that semiconductor chips (such as the microelectronic elements 30) transmit and receive through the contacts 35 thereof.

Thus, in one example, each of the microelectronic elements 30 can be of DDRx type, i.e., configured in accordance with one of the JEDEC double data rate DRAM standards DDR3, DDR4, or one or more of their follow-on standards (collectively, "DDRx"). Each DDRx type microelectronic element can be configured to sample the command and address information coupled to the contacts thereof at a first sampling rate, such as once per clock cycle (e.g., on the rising edge of the clock cycle). In particular examples, the DDRx type microelectronic elements can have four, eight or sixteen contacts used for transmitting and receiving bi-directional data signals, each such bi-directional signal referred to as a "DQ" signal. Alternatively, the first terminals of a package can be configured to carry uni-directional data signals such as data signals or "D" signals input to the package and data signals "Q" output from the package, or can be configured to carry a combination of bi-directional and uni-directional data signals.

In another example, each of the microelectronic elements 30 can be of LPDDRx type, i.e., configured in accordance with one of the JEDEC low power double data rate DRAM standards LPDDR3 or one or more of its follow-on standards (collectively, "LPDDRx"). LPDDRx type DRAM chips are available which have 32 contacts assigned to carry DQ signals. There are other differences as well. Each contact 35 on an LPDDRx type DRAM chip may be used to simultaneously carry two different signals in interleaved fashion. For example, each contact 35 on such DRAM chip can be assigned to carry one signal which is sampled on the rising edge of the clock cycle and can also be assigned to carry another signal that is sampled on the falling edge of the clock cycle.

Thus, in LPDDRx type chips, each microelectronic element 30a, 30b, 30c can be configured to sample the command and address information input to the contacts thereof at a second sampling rate, such as twice per clock cycle (e.g., on both the rising edge and on the falling edge of the clock cycle). Accordingly, the number of contacts on the LPDDRx DRAM chip that carry address information or command-address bus information can also be reduced. In a particular example of LPDDRx type chips, one or more of the contacts 35 of each microelectronic element 30a, 30b, 30c can be configured to carry address information at one edge of the clock cycle and command information at another edge of the clock cycle, such that a single contact can be used to alternatingly receive command and address information. Such contacts and/or terminals that are configured to alternatingly receive command and address information can be included in any of the embodiments described herein.

Electrical connections between the contacts 35 and the terminals 25 can include leads, e.g., wire bonds 40, or other possible structure in which at least portions of the leads are aligned with at least one of the apertures 26. For example, as seen in FIG. 1A, at least some of the electrical connections can include a wire bond 40 that extends beyond an edge of an aperture 26 in the dielectric element 20, and is joined at one end to the contact 35 of a microelectronic element and to a conductive element 24 of the dielectric element 20 at another end. In one example, at least some of the leads can include wire bonds 40 extending through at least one of the apertures 26a, 26b, 26c. In one embodiment, at least some of the electrical connections between the dielectric element and the contacts of the microelectronic element can be through lead bonds, i.e., leads that are integral with other conductive elements on the dielectric element and which extend in a lateral direction along one or both of the first and second surfaces 21, 22 of the dielectric element 20 and are bonded to contacts of one or more of the microelectronic elements, each lead having a portion aligned with at least one of the apertures 26.

The microelectronic package 10 can also include an encapsulant 50 that can optionally cover, partially cover, or leave uncovered the rear surfaces 33 of the microelectronic elements 30. For example, in the microelectronic package 10 shown in FIG. 1A, an encapsulant can be flowed, stenciled, screened or dispensed onto the rear surfaces 33 of the microelectronic elements 30. The microelectronic package 10 can further include an encapsulant 51 that can optionally cover the wire bonds 40 and the conductive elements 24 of the dielectric element 20. Such an encapsulant can also optionally extend into the apertures 26, and it can cover the contacts 35 of the microelectronic elements 30.

In the embodiment of FIGS. 1A and 1B, at least some signals that pass through at least some of the first terminals 25a of the package can be common to at least two of the microelectronic elements 30, while other signals that pass through at least some of the first terminals of the package may only be electrically connected with one of the microelectronic elements. These signals can be routed through connections such as conductive traces extending on or within the dielectric element 20 in directions parallel to the first and second surfaces 21, 22 of the dielectric element from the terminals 25 to the corresponding contacts 35 of the microelectronic elements 30.

For example, a first terminal 25a in a first set 15a of the first terminals disposed in the central region 23 of the second surface 22 of the dielectric element 20 can be electrically coupled with a conductive contact 35 of each of the first and third microelectronic elements 30a and 30c through conductive traces, conductive elements 24, e.g., bond pads, and wire bonds 40 joined to corresponding ones of the conductive elements and the contacts. A first terminal 25a in a second set 15b of the first terminals disposed in the central region 23 of the second surface 22 of the dielectric element 20 can be electrically coupled with a conductive contact 35 of only the second microelectronic element 30b through conductive traces, a conductive element 24, e.g., a bond pad, and a wire bond 40 joined to corresponding ones of the conductive elements and the contacts.

In one example, the first group 15a of first terminals 25a disposed on a first side of a theoretical axis 29d can have signal assignments that are symmetric about the axis 29d with the signal assignments of the second group 15b of first terminals that are disposed on a second side of the axis 29d. The theoretical axis 29d can extend parallel to the longitudinal axis 29 of each of the apertures 26 and is disposed between the proximate edges of the respective apertures. In the example shown in FIG. 1B, the theoretical axis 29d can be coincident with the third axis 29c, although that need not always be the case. In each of the examples shown in FIGS. 1F and 1G, the first group 15a of first terminals 25a disposed on a first side of the theoretical axis 29d has signal assignments that are symmetric about the axis 29d with the signal assignments of the second group 15b of first terminals that are disposed on a second side of the axis 29d. In particular embodiments (not shown), the first group 15a of first terminals 25a may have signal assignments that are not symmetric about a theoretical axis with the signal assignments of the second group 15b of first terminals.

Typically, the theoretical axis 29d is disposed at or near the median distance between the proximate edges of the first and second apertures 26a, 26b. "Symmetric" as used herein in connection with signal assignments of terminals for carrying address information means that the signal assignment of a terminal on a first side of the theoretical axis has a name and numerical weight which are the same as that of another terminal on an opposite side of the axis at a position symmetric about the axis from the terminal on the first side. The "numerical weight" of the address information assigned to a given terminal refers to the place of that address information within the places of an address that is specified by the address information. For example, an address can be specified by 20 address bits A0 . . . A19. Each bit has a numerical weight, from the highest-ordered address information bit A19, which has a numerical weight of 19 representing 2^19 (2 to the power of 19), to the lowest-ordered address information bit A0, which has a numerical weight of zero representing 2^0 (2 to the power of zero), which is the 1's place of the address.

In a particular embodiment, the first and second groups 15a, 15b of first terminals 25a of the microelectronic package 10 can be configured to have modulo-X symmetry about the theoretical axis 29d. Microelectronic packages having groups of address and/or data terminals having modulo-X symmetry are shown and described in U.S. Pat. Nos. 8,441,111 and 9,123,555, which are hereby incorporated by reference herein in their entireties.

Figure 2:
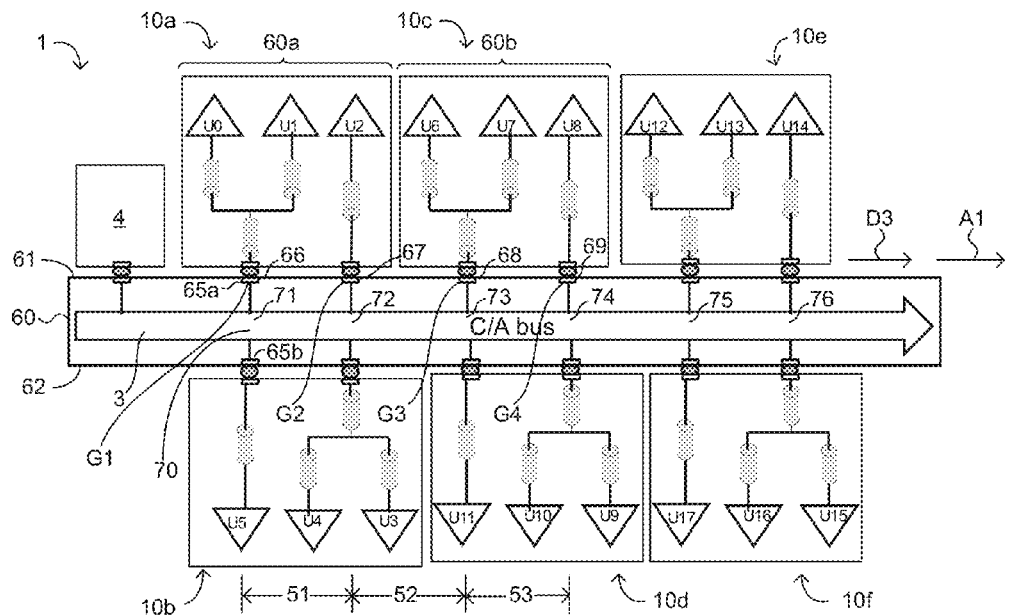
FIG. 2 is a diagrammatic representation of the electrical connections for address signals within a microelectronic assembly including the microelectronic package shown in FIG. 1A.

As can be seen in FIG. 1C, such an example can have two independent sets of electrical connections between the microelectronic package 10 and a signal bus (e.g., the address bus or command/address bus 3 on the circuit panel 60 in FIG. 2). As shown in FIG. 1C, two of the memory arrays U0, U1 of the microelectronic elements 30a, 30c, respectively, can have a shared electrical connection 2a to a first set 15a of first terminals 25a on the second surface 22 of the substrate 20, while a third memory array U2 of the microelectronic element 30b can have an independent electrical connection 2b to a second set 15b of the first terminals on the second surface of the substrate.

Stated another way, in the microelectronic package 10, the first set 15a of the first terminals 25a are electrically connected with the first and third microelectronic elements 30a, 30c and not electrically connected with the second microelectronic element 30b, and the second set 15b of the first terminals are electrically connected with the second microelectronic element and not electrically connected with the first or third microelectronic elements. In this way, the first and third microelectronic elements 30a, 30c share an electrical connection 2a to the first set 15a of the first terminals 25a, and the second microelectronic element 30b has an unshared independent electrical connection 2b to a second set 15b of the first terminals.

In one potential example of the terminal configuration of the microelectronic package 10 described above, FIG. 1F shows a microelectronic package 110 having a ball map that can apply to the microelectronic package 10 depicted in FIGS. 1A and 1B. The microelectronic package 110 has an exemplary ballout map of terminals 25 on the second surface 22 of the substrate 20, wherein terminals A0-A16 are address terminals that can be first terminals 25a. The first terminals 25a can include first and second sets 15a, 15b that can each have an independent electrical connection to an address bus or command/address bus of a circuit panel such as the circuit panel 60. The terminals DQ0-DQ7 are data terminals that can be second terminals 25b. The second terminals 25b can include first, second, and third sets 17a, 17b, 17c that can each have an independent electrical connection to a data bus of a circuit panel such as the circuit panel 60. Other terminals 25 on the ballout map can be as shown in FIG. 1F. In one example, the microelectronic elements 30 in the microelectronic package 110 can be configured in accordance with one of the JEDEC double data rate DRAM standard DDR4.

In another potential example of the terminal configuration of the microelectronic package 10 described above, FIG. 1G shows a microelectronic package 210 having a ball map that can apply to the microelectronic package 10 depicted in FIGS. 1A and 1B. The microelectronic package 210 has an exemplary ballout map of terminals 25 on the second surface 22 of the substrate 20, wherein terminals A0-A16 are address terminals that can be first terminals 25a. The first terminals 25a can include first and second sets 15a, 15b that can each have an independent electrical connection to an address bus or command/address bus of a circuit panel such as the circuit panel 60. Terminals DQ0-DQ3 are data terminals that can be second terminals 25b. The second terminals 25b can include first, second, and third sets 17a, 17b, 17c that can each have an independent electrical connection to a data bus of a circuit panel such as the circuit panel 60. Other terminals 25 on the ballout map can be as shown in FIG. 1G. In one example, the microelectronic elements 30 in the microelectronic package 210 can be configured in accordance with one of the JEDEC double data rate DRAM standard DDR4.

Figure 1H:
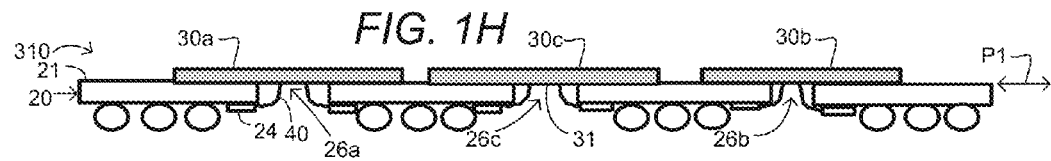
FIG. 1H is a sectional view of an alternative configurations of microelectronic elements of the microelectronic package shown in FIG. 1A.

FIG. 1H shows a microelectronic package 310 that is a variation of the embodiment of FIGS. 1A and 1B. Each feature or element of the microelectronic package 310 can be the same as a corresponding feature or element of the microelectronic package 10, except as otherwise described below. In FIG. 1H, the microelectronic elements 30a, 30b, 30c can be disposed adjacent to one another, with the front faces 31 facing toward the first surface 21 of the substrate 20 and arranged in a single plane P parallel to the first surface of the substrate. In this variation, similar to the embodiment of FIGS. 1A and 1B, each of the microelectronic elements 30 can be electrically connected to substrate contacts 24 by leads (e.g., wire bonds 40) aligned with apertures 26a, 26b, 26c extending through the substrate 20.

Although the microelectronic elements 30 are shown in FIGS. 1A and 1H as being wire bonded to contacts of the substrate with their front faces facing the first surface of the package substrate, that need not be the case. For example, in other embodiments, a variation of the microelectronic package 10 can have microelectronic elements each bearing element contacts at a front face thereof, the front faces facing away from the first surface of the substrate. The microelectronic elements can each be electrically connected with conductive elements of the substrate by electrically conductive structure such as wire bonds extending above the front face between the element contacts and substrate contacts at the first surface of the substrate. The substrate contacts can be electrically connected with the terminals at the second surface of the substrate. In some variations, the front faces of the microelectronic elements can be arranged in a single plane parallel to the first surface of the substrate, or alternatively, the microelectronic elements can be arranged in a vertical stack above the first surface of the substrate.

In another embodiment, a variation of the microelectronic package 10 can have microelectronic elements each bearing element contacts a front face thereof, the front faces facing toward the first surface of the substrate, with the element contacts facing and joined to substrate contacts at the first surface of the substrate by conductive joining material extending therebetween. The substrate contacts can be electrically connected with the terminals at the second surface of the substrate.

In yet another variation of the of the microelectronic package 10, the substrate can be omitted, such that the microelectronic package 10 can be in form of microelectronic elements 30 having packaging structure that includes an electrically conductive redistribution layer overlying the front face 31 of one or more of the microelectronic elements. The redistribution layer has electrically conductive metallized vias extending through a dielectric layer of the package to the element contacts 35 of the microelectronic elements 30. The redistribution layer may include the terminals 25 and traces electrically connected with the terminals, such that the terminals are electrically connected with the element contacts, such as through the metallized vias or through metallized vias and electrically conductive traces. In this case, the package can be referred to as a "wafer-level package having a redistribution layer thereon." In an additional variation, such a microelectronic package having a redistribution layer thereon as described above can have one or more columns of the terminals 25 disposed on areas of the dielectric layer that extend laterally beyond one or more edges of the microelectronic elements. In this case, the package can be referred to as a "fan-out wafer-level package having a redistribution layer thereon."

Referring to FIG. 2, in accordance with an aspect of the invention, a microelectronic assembly 1 can include first, second, third, fourth, fifth, and sixth microelectronic packages 10a, 10b, 10c, 10d, 10e, and 10f (collectively, the microelectronic packages 10) assembled with a circuit panel 60 in a clamshell arrangement, with the first, third, and fifth microelectronic elements mounted to the first surface 61 of the circuit panel, and with the second, fourth, and sixth microelectronic elements mounted to the second surface 62 of the circuit panel. Specifically, as seen in FIG. 2, the packages 10a, 10b can be mounted opposite one another to respective panel contacts at the first and second surfaces 61, 62 of the circuit panel 60, such that the first package 10a occupies the same or substantially the same area of the circuit panel as the second package 10b.

Each of the microelectronic packages 10 of the microelectronic assembly 1 can have a similar structure that includes first, second, and third microelectronic elements 30 as described above with reference to FIGS. 1A and 1B. As can be seen in FIG. 2, each of the memory arrays U0 through U17 of the microelectronic elements 30 within the microelectronic packages 10 can be electrically connected to a connection region 70 of an address bus or command/address bus 3 on the circuit panel 60, via a shared electrical connection 2a or an independent electrical connection 2b. In the examples herein, each memory array U0 through U17 is located within a corresponding microelectronic element 30.

Figure 3:
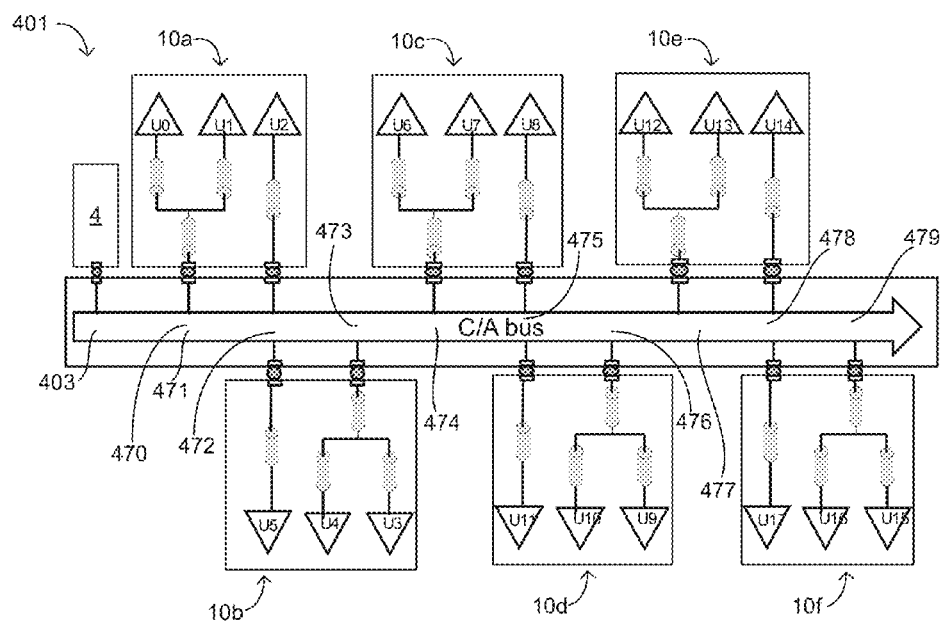
FIG. 3 is a diagrammatic representation of the electrical connections for address signals within a microelectronic assembly including the microelectronic package shown in FIG. 1A, which is a variation of the microelectronic assembly of FIG. 2.
Figure 4:
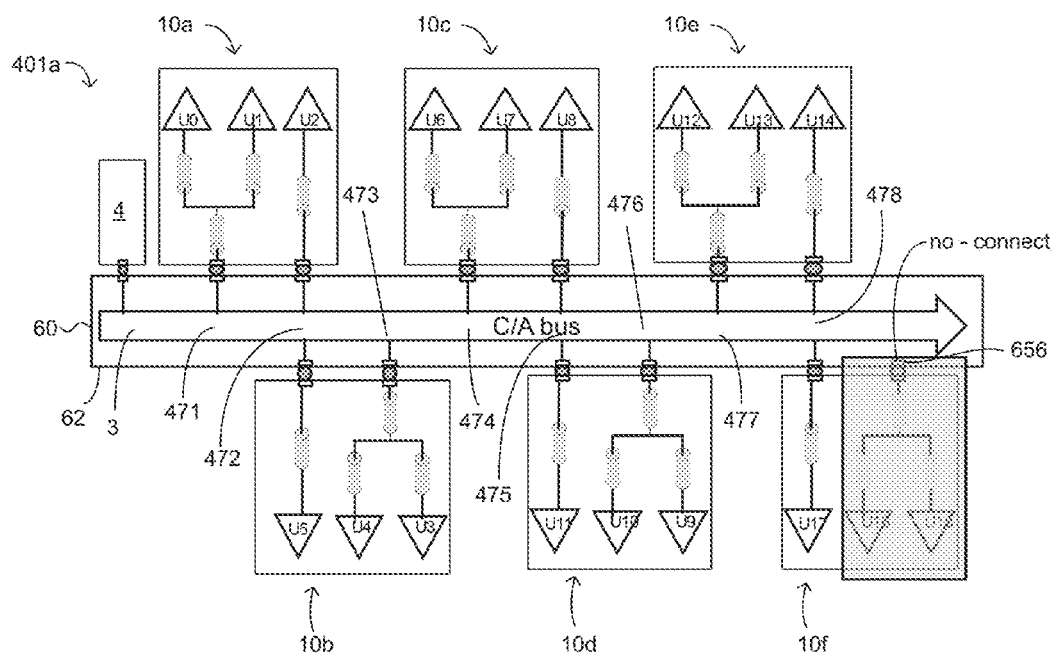
FIG. 4 is a diagrammatic representation of the electrical connections for address signals within a microelectronic assembly including the microelectronic package shown in FIG. 1A, which is a variation of the microelectronic assembly of FIG. 3.

In the examples of FIGS. 2-4, the first, second, and third microelectronic elements 30a, 30b, and 30c of the first microelectronic package 10a contain memory arrays U0, U1, and U2, respectively, and the first, second, and third microelectronic elements of the second microelectronic package 10b contain memory arrays U3-U5, respectively. In similar fashion, the first, second, and third microelectronic elements 30a, 30b, and 30c of the third microelectronic package 10c contain memory arrays U6-U8, respectively, the first, second, and third microelectronic elements of the fourth microelectronic package 10d contain memory arrays U9-U11, respectively, the first, second, and third microelectronic elements of the fifth microelectronic package 10e contain memory arrays U12-U14, respectively, and the first, second, and third microelectronic elements of the sixth microelectronic package 10f contain memory arrays U15-U17, respectively.

The microelectronic assembly 1 can include an address bus or command-address bus 3 that can comprise a plurality of signal conductors each passing sequentially through connection regions 70 of the circuit panel 60 such as first, second, third, fourth, fifth, and sixth connection regions 71, 72, 73, 74, 75, and 76. The bus 3 can extend within or on a support, which may be a portion of the circuit panel 60. The bus 3 can comprise a plurality of signal conductors for transmitting address signals or address and command signals. The circuit panel 60 can have conductive panel contacts 65 at a surface of the support, such as the first panel contacts 65a at the first surface 61 of the circuit panel and the second panel contacts 65b at the second surface 62 of the circuit panel. The microelectronic packages 10 can be mounted to the panel contacts 65, for example, by joining elements 11 that can extend between the terminals 25 and the panel contacts.

The address bus or command-address bus 3 can comprise a plurality of signal conductors electrically connected with a plurality of mutually exclusive connection regions 71-76. As used herein, "mutually exclusive" connection regions are not electrically connected to one another within the circuit panel 60. In the example shown in FIG. 2, each connection region 70 can include first panel contacts 65a disposed at the first surface 61 and second panel contacts 65b disposed at the second surface 62, and the first and second panel contacts in a particular connection region can be electrically coupled with one another. Thus, at least some first terminals 25a of both a first microelectronic package 10a and a second microelectronic package 10b can be electrically coupled with one another through a particular connection region (e.g., the first connection region 71).

In one example, the address bus 3 can be configured to carry all address signals usable by circuitry within the microelectronic packages 30. In a particular example (e.g., DDR3 chips), the address bus 3 can be configured to carry all command signals transferred to each of the microelectronic packages 30, the command signals being write enable, row address strobe, and column address strobe signals. In one embodiment (e.g., DDR4 chips), all of the command signals transferred to each of the microelectronic packages 30 can be write enable, row address strobe, column address strobe, activate, and parity signals. The first terminals 25a of each of the microelectronic packages 30 can be configured to carry all of the address signals usable by circuitry within the respective microelectronic package.

On the circuit panel 60, e.g., a printed circuit board, module card, etc., these above-noted signals of the command-address bus: i.e., command signals, address signals, bank address signals, and clock signals, can be bussed to multiple microelectronic packages 10 that are connected thereto in parallel, for example, to first and second microelectronic packages 10a, 10b mounted to opposite surfaces of the circuit panel in a clamshell configuration.

In one embodiment, the first terminals 25a of the respective microelectronic packages 10 can be functionally and mechanically matched, such that each microelectronic package can have the same pattern of first terminals at the second surface 22 of the substrate 20 of the respective microelectronic package with the same function, although the particular dimensions of the length, width, and height of each microelectronic package can be different than that of the other microelectronic packages.

In one example, each of the sets or groups 15a and 15b of the first terminals 25a of each microelectronic package 30 can be configured to carry all of the same address signals. As can be seen in FIG. 2, in a particular embodiment, each of the sets or groups 15a and 15b of the first terminals 25a of each microelectronic package 30 can be disposed in respective first and second opposite sides of a theoretical axis 29d extending along the second surface 22 of the respective substrate 20. In one example, the first terminals 25a of the first and second microelectronic packages 10a, 10b can be arranged at positions of first and second grids, and the first and second grids can be aligned with one another in x and y orthogonal directions parallel to the first and second surfaces 61, 62 of the circuit panel 60, the alignment being within a distance equal to a minimum pitch P1 (FIG. 1A) between adjacent terminals of the grids.

As can be seen in FIG. 2, each of the connection regions 71-76 of the address bus 3 is electrically connected with three corresponding ones of the microelectronic elements 30 containing three corresponding ones of the memory arrays U0-U17. Also in this example, each microelectronic element 30 in the microelectronic assembly 1 may be electrically coupled to the address bus 3 via only one of the connection regions 71-76. Therefore, although both of the first and second microelectronic packages 10a and 10b are electrically connected with both the first and second connection regions 71, 72, each of the first and second connection regions is electrically connected with only one of the sets 15 of the first terminals 25a of each of the first and second microelectronic packages.

For example, as shown in FIG. 2, the first connection region 71 is electrically connected only with memory arrays U0 and U1 of the first microelectronic package 10a (via the first set 15a of the first terminals 25a) and with memory array U5 of the second microelectronic package 10b (via the second set 15b of the first terminals). Therefore, the first connection region 71 is electrically connected only with the first and third microelectronic elements 30a, 30c of the first microelectronic package 10a and with the second microelectronic element 30b of the second microelectronic package 10b.

Likewise, the second connection region 72 is electrically connected only with memory array U2 of the first microelectronic package 10a (via the second set 15b of the first terminals 25a) and with memory arrays U3 and U4 of the second microelectronic package 10b (via the first set 15a of the first terminals). Therefore, the second connection region 72 is electrically connected only with the second microelectronic element 30b of the first microelectronic package 10a and with the first and third microelectronic elements 30a, 30c of the second microelectronic package 10b.

Stated another way, the first and third microelectronic elements 30a, 30c of the first microelectronic package 10a and the second microelectronic element 30b of the second microelectronic package 10b can be electrically coupled to the address bus 3 only at a first one of the connection regions 71, and the second microelectronic element 30b of the first microelectronic package 10a and the first and third microelectronic elements 30a, 30c of the second microelectronic package 10b are electrically coupled to the address bus only at a second one of the connection regions 72. In one example, the first and third microelectronic elements 30a, 30c of the third microelectronic package 10c and the second microelectronic element 30b of the fourth microelectronic package 10d can be electrically coupled to the address bus 3 only at a third one of the connection regions 73, and the second microelectronic element 30b of the third microelectronic package 10c and the first and third microelectronic elements 30a, 30c of the fourth microelectronic package 10d are electrically coupled to the address bus only at a fourth one of the connection regions 74.

In some examples, the microelectronic assembly 1 can further include an optional controller package 4 electrically coupled to the address bus or command-address bus 3. The controller package 4 can include a controller element configured to control generation of address signals for transmission on the bus 3. In one example, first and second microelectronic packages 10a, 10b can overlie respective first and second areas of a same surface of the support or circuit panel 60, and the controller package 4 can overlie a third area of the circuit panel. Such a controller package 4 may be included in embodiments of the microelectronic assembly 1 where the assembly is a registered DIMM. In other embodiments, the microelectronic assembly may not include the controller package 4 where the assembly is a DIMM without registers, e.g., UDIMM (unregistered DIMM).

As illustrated in FIG. 2, signals transported by the address bus or command-address bus 3 can be routed in at least one direction D3 between connection sites on a circuit panel such as the circuit panel 60 at which a plurality of microelectronic packages 10 are connected, such that signals of the bus reach each connection region 70 at different times.

The at least one direction D3 can be transverse or orthogonal to a direction D2 (FIG. 1E) in which at least one column 36 of a plurality of contacts 35 on at least one microelectronic element 30 extends. In such a way, the signal conductors of the command-address bus 3 on (i.e., on or within) the circuit panel 60 can in some cases be spaced apart from one another in the direction D2 that is parallel to the at least one column 36 of contacts 35 on a microelectronic element 30 within a microelectronic package 10 connected to, or to be connected to the circuit panel 60.

In the embodiment shown in FIG. 2, the microelectronic packages 10a and 10c can be first and third microelectronic packages each joined to the panel contacts 65a at respective first and second different areas 60a, 60b of the first surface 61 of the circuit panel 60. The first microelectronic package 10a can include first, second, and third microelectronic elements 30a, 30b, 30c having memory arrays U0, U1, and U2, and the third microelectronic package 10c can include first, second, and third microelectronic elements 30a, 30b, 30c having memory arrays U6, U7, and U8.

The first terminals 25a of the microelectronic packages 10a and 10c can be electrically coupled to first, second, third, and fourth sets 66, 67, 68, and 69 of the first panel contacts 65a. In turn, the first, second, third, and fourth sets 66, 67, 68, and 69 of the first panel contacts 65a can be electrically coupled to the signal conductors of the bus 3. In one example (e.g., DDR3 chips), each of the first, second, third, and fourth sets 66, 67, 68, and 69 of first panel contacts 65a can be configured to carry address information usable by circuitry within the microelectronic packages 10 and command signals transferred to the microelectronic packages, the command signals being write enable, row address strobe, and column address strobe signals. In one embodiment (e.g., DDR4 chips), the command signals transferred to the microelectronic packages can be write enable, row address strobe, column address strobe, activate, and parity signals.

Each of the memory arrays U0, U1, U2, U6, U7, and U8 of the microelectronic packages 10a, 10c can be electrically coupled to the signal conductors of the bus 3 at one of the connection regions 71, 72, 73, 74 via a set 66, 67, 68, 69 of the first panel contacts 65a and via packaging structure (e.g., first terminals 25a) of the respective microelectronic package for receiving address signals or address and command signals.

In the embodiment shown in FIG. 2, each of the memory arrays U0, U1, U2, U6, U7, and U8 of the microelectronic packages 10a, 10c can be electrically coupled to the bus 3 at only one of the first, second, third, and fourth connection regions 71, 72, 73, 74. In a particular example, a memory array U0 of a first microelectronic package 10a can have address inputs coupled only to the first set 66 of first panel contacts 65a, and a memory array U2 of the first microelectronic package 10a can have address inputs coupled only to the second set 67 of first panel contacts 65a.

In the example shown in FIG. 2, geometric centers G1, G2, and G3 of the respective first, second, and third sets 66, 67, 68 of the first panel contacts 65a have first, second, and third substantially equal relative separation distances S1, S2, and S3 from the geometric centers G2, G3, and G4 of the second, third, and fourth sets 66, 67, 68 of the panel contacts, respectively. In one example, any difference among the first, second, and third substantially equal relative separation distances S1, S2, and S3 can fall within a same tolerance, for example, a same tolerance of ±0.5 mm, or in a particular embodiment, a same tolerance of ±1% of any one of the separation distances.

In one embodiment, the geometric centers G1, G2, G3, and G4 of the respective first, second, third, and fourth sets 66, 67, 68, 69 of the first panel contacts 65a can be equally spaced from one another along a common theoretical axis A1 extending parallel to the first surface 61 of the circuit panel 60. As used herein, a statement that elements are "equally spaced" with respect one another along a common theoretical axis means that the actual difference in spacing between adjacent ones of the elements is within a typical manufacturing tolerance known to one skilled in the relevant art.

In the embodiment of FIG. 2, an electrical characteristic between the first and second connection regions 71, 72 can be within a same tolerance of the electrical characteristic between the second and third connection regions 72, 73. The electrical characteristic can be, for example, an electrical trace length, an electrical propagation delay, a characteristic impedance of the signal conductors, or a difference in electrical load applied to the address bus from the microelectronic element connected with the respective connection region.

In one embodiment, each of the first, second, and third connection regions 71, 72, 73 can have respective first, second, and third relative electrical lengths (i.e., electrical trace lengths) from the respective second, third, and fourth connection regions 72, 73, 74, and any difference among the first, second, and third relative electrical lengths can fall within a same tolerance, for example, a same tolerance of ±0.5 mm, or in a particular embodiment, a same tolerance of ±1% of any one of the relative electrical lengths. In a particular embodiment, an electrical trace length between the first and second connection regions 71, 72 can be within a same tolerance of the electrical trace length between the second and third connection regions 72, 73.

In a particular embodiment, each of the second, third, and fourth connection regions 72, 73, and 74 can be configured to receive address signals from the bus 3 at respective first, second, and third relative delays (i.e., electrical propagation delays) from the respective first, second, and third connection regions 71, 72, and 73, and any difference among the first, second, and third relative delays can fall within a same tolerance, for example, a same tolerance of ±1% of any one of the relative delays. In a particular embodiment, an electrical propagation delay between the first and second connection regions 71, 72 can be within a same tolerance of the electrical propagation delay between the second and third connection regions 72, 73.

In one example, a characteristic impedance of the signal conductors of the bus 3 between the first and second connection regions 71 and 72, and the characteristic impedance of the signal conductors between the second and third connection regions 72 and 73 can fall within a same tolerance, for example, a same tolerance of ±5 ohms. Likewise, a characteristic impedance of the signal conductors of the bus 3 between the first and second connection regions 71 and 72, the characteristic impedance of the signal conductors of the bus 3 between the second and third connection regions 72 and 73, and the characteristic impedance of the signal conductors between the third and fourth connection regions 73 and 74 can fall within a same tolerance, for example, a same tolerance of ±5 ohms.

In one example, each of the groups of microelectronic elements 30 electrically connected to a particular one of the connection regions 71-76 can be configured to apply substantially a same load (i.e., electrical load) to the bus 3 as any other of the groups of microelectronic elements 30 electrically connected to another one of the connection regions 71-76, for example, within a tolerance of ±5 ohms In a particular embodiment, a difference in electrical load applied to the address bus 3 via the first and second connection regions 71, 72 can be within a same tolerance of the difference in electrical load applied to the address bus via the second and third connection regions 72, 73. For example, the same tolerance of the difference in electrical load applied to the address bus can be within a tolerance of ±5 ohms.

FIG. 3 illustrates a microelectronic assembly 401 that is a variation of the microelectronic assembly 1 of FIG. 2. Each feature or element of the microelectronic assembly 401 can be the same as a corresponding feature or element of the microelectronic assembly 1, except as otherwise described below. As can be seen in FIG. 3, each of the connection regions 471-479 (collectively 470) of the address bus 403 is electrically connected with two corresponding ones of the microelectronic elements 30 containing two corresponding ones of the memory arrays U0-U17. Also in this example, each microelectronic element 30 in the microelectronic assembly 401 may be electrically coupled to the address bus 3 via only one of the connection regions 471-479. Therefore, although both of the first and second microelectronic packages 10a and 10b are electrically connected with two of the connection regions 470, each of the connection regions is electrically connected with only two of the memory arrays U0-U17.

In the example of FIG. 3, the microelectronic packages 10 are in a staggered clamshell configuration. For example, the packages 10a, 10b can be mounted opposite one another to respective panel contacts at the first and second surfaces 61, 62 of the circuit panel 60, but the first package 10a only occupies a portion of the same area of the circuit panel as the second package 10b, and another portion of the first package does not occupy the same area as the second package.

Since each connection region is electrically connected with only two of the memory arrays U0-U17, the first set 15a of the first terminals 25a of each microelectronic package 10, through which the first and third microelectronic elements 30a, 30c have a shared electrical connection 2a to the address bus or command/address bus 3, does not share a connection region 470 with any other microelectronic package. However, the second set 15b of the first terminals 25a of each microelectronic package 10, through which the second microelectronic element 30b has an independent electrical connection 2b to the address bus or command/address bus 3, shares its connection region with a corresponding second set of first terminals of another microelectronic package mounted to the opposite side of the circuit panel 60.

Therefore, in the example shown in FIG. 3, the odd connection regions 471, 473, 475, 477, and 479 are only connected with a first set 15a of first terminals 25a of a single corresponding microelectronic package 10, while even connection regions 472, 474, 476, and 479 are connected with a second set 15b of first terminals of two microelectronic packages 10 at opposite sides of the circuit panel. Similar to the example of FIG. 2, each microelectronic element 30 (and each memory array U0-U17) of the microelectronic assembly 401 is electrically coupled to the address bus 3 via only one of the connection regions 470.

More specifically, in the microelectronic assembly 401, the first and third microelectronic elements 30a, 30c of the first microelectronic package 10a are electrically coupled to the address bus 3 only at a first one of the connection regions 471, the second microelectronic element 30b of the first microelectronic package and the second microelectronic element of the second microelectronic package 10b are electrically coupled to the address bus only at a second one of the connection regions 472, and the first and third microelectronic elements of the second microelectronic package are electrically coupled to the address bus only at a third one of the connection regions 473. This pattern is repeated for the third through sixth microelectronic packages 10c-10f.

In the embodiment of FIGS. 2 and 3, when each microelectronic element 30 is configured to carry 4 bi-directional data signals DQ0 . . . DQ3 (e.g., FIG. 1G), the microelectronic assemblies 1 or 401 can each be configured to transmit 72 bi-directional data signals in tandem to support 72-bit single-rank memory access, including 8 bits for error correction. Alternatively, the embodiments of FIGS. 2 and 3 could be expanded to include 12 microelectronic packages containing 36 microelectronic elements total, each microelectronic element configured to carry 4 bi-directional data signals. In such embodiments, the microelectronic assemblies 1 or 401 can each be configured to transmit 72 bi-directional data signals in tandem to support 72-bit dual-rank memory access, including 8 bits for error correction per rank. When each microelectronic element 30 is configured to carry 8 bi-directional data signals DQ0 . . . DQ7 (e.g., FIG. 1F), the microelectronic assemblies 1 or 401 can each be configured to transmit 72 bi-directional data signals in tandem to support 72-bit dual-rank memory access, including 8 bits for error correction per rank.

FIG. 4 illustrates a microelectronic assembly 401a that is a variation of the microelectronic assembly 401 of FIG. 3. Each feature or element of the microelectronic assembly 401a can be the same as a corresponding feature or element of the microelectronic assembly 401, except as otherwise described below. The microelectronic assembly 401a is the same as the microelectronic assembly 401, except that the ninth connection region 479 is omitted, leaving eight connection regions 471-478 on the address bus 3. This reduction of connection regions can be accomplished by using no-connect panel contacts as the second panel contacts 65b that are electrically connected with the first set 15a of first terminals 25a, which are electrically connected with the memory arrays U16 and U15. As used herein, a "no-connect" panel contacts not connected in any electrical path to the address bus within the microelectronic assembly. By removing the electrical connections between the address bus 3 and two of the eighteen microelectronic elements 30 within the microelectronic assembly 401a, that can remove the error-correction feature of the microelectronic assembly 401a.

In the embodiment of FIG. 4, when each microelectronic element 30 is configured to carry 4 bi-directional data signals DQ0 . . . DQ3 (e.g., FIG. 1G), the microelectronic assembly 401a can be configured to transmit 64 bi-directional data signals in tandem to support 64-bit single-rank memory access, without error correction. Alternatively, the embodiment of FIG. 4 could be expanded to include 11 or 12 microelectronic packages 10 containing 33 or 36 microelectronic elements total, each microelectronic element configured to carry 4 bi-directional data signals. In such embodiments, if only 32 of the microelectronic elements are electrically connected to the address bus, the microelectronic assembly 401a can be configured to transmit 64 bi-directional data signals in tandem to support 64-bit dual-rank memory access, without error correction. When each microelectronic element 30 is configured to carry 8 bi-directional data signals DQ0 . . . DQ7 (e.g., FIG. 1F), the microelectronic assembly 401a can each be configured to transmit 64 bi-directional data signals in tandem to support 64-bit dual-rank memory access, without error correction.

In the example of FIG. 4, the electrical connections between the microelectronic packages 10 and the address bus 3 are the same as with the microelectronic assembly 401, except for the sixth microelectronic package 10f. In this example, the first and third microelectronic elements 30a, 30c of the fifth microelectronic package 10e are electrically coupled to the address bus only at a seventh one of the connection regions 477, the second microelectronic element 30b of the fifth microelectronic package and the second microelectronic element of the sixth microelectronic package 10f are electrically coupled to the address bus only at an eighth one of the connection regions 478, and the first and third microelectronic elements of the sixth microelectronic package are not electrically coupled to the address bus 3. To accomplish this, the first and third microelectronic elements 30a, 30c of the sixth microelectronic package can be electrically coupled to second panel contacts 65b disposed at the second surface 62 of the circuit panel 60, but the such panel contacts are not connected in any electrical path to the address bus 3 within the microelectronic assembly 401a.

In the examples of the microelectronic assemblies 1, 401, 401a described herein having microelectronic packages 10 configured to apply balanced electrical connections to the address bus or command/address bus 3 (through independent groups 15a, 15b of first terminals each connected to only one of the connection regions 70), the electrical loads may be distributed more evenly distributed along the signal conductors of the fly-by bus 3 compared to conventional microelectronic assemblies.

Such microelectronic assemblies 1, 401, 401a may result in better impedance matching between adjacent connection regions along the bus 3, and more bandwidth capability along the bus to handle higher frequency signals, compared to conventional microelectronic assemblies. The inventors have found that in use, the structure of the microelectronic assemblies 1, 401, 401a may produce significantly lower reflection compared to conventional microelectronic assemblies, thereby permitting the assembly to operate at a higher bandwidth with better signal transmission than conventional microelectronic assemblies.

In one embodiment, the connection regions 71, 72, 73, and 74 need not all be disposed on a single circuit panel. For example, connection regions 71, 72 to which the microelectronic elements of a first package 10a are coupled can be disposed on a circuit panel other than the circuit panel on which the connection regions 73, 74 coupled to the second package 10c are disposed.

Although in the embodiments described herein, the first terminals 25a of the microelectronic packages 30 were disposed in the central region 23 of the second surface 22 of the substrate 20, in other examples, the first terminals can be disposed anywhere on the substrate. Although in the embodiments described herein, the first and second sets 17a, 17b of the second terminals 25b of the microelectronic packages 30 were disposed in the peripheral regions 28 of the second surface 22 of the substrate 20, in other examples, the first and second sets of the second terminals can be disposed anywhere on the substrate. Although in the embodiments described herein, the third set 17c of the second terminals 25b of the microelectronic packages 30 were disposed in the central region 23 of the second surface 22 of the substrate 20, on both sides of the third aperture 26c, in other examples, the third set of the second terminals can be disposed anywhere on the substrate, and the third set of the second terminals need not be distributed on both sides of the third aperture.

Figure 5:
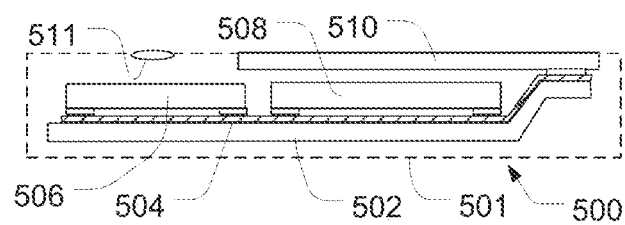
FIG. 5 is a schematic depiction of a system according to one embodiment of the invention.

The microelectronic packages and microelectronic assemblies described above with reference to FIGS. 1A through 4 above can be utilized in construction of diverse electronic systems, such as the system 500 shown in FIG. 5. For example, the system 500 in accordance with a further embodiment of the invention includes a plurality of modules or components 506 such as the microelectronic packages and microelectronic assemblies as described above, in conjunction with other electronic components 508, 510 and 511.

In the exemplary system 500 shown, the system can include a circuit panel, motherboard, or riser panel 502 such as a flexible printed circuit board, and the circuit panel can include numerous conductors 504, of which only one is depicted in FIG. 5, interconnecting the modules or components 506, 508, 510 with one another. Such a circuit panel 502 can transport signals to and from each of the microelectronic packages and/or microelectronic assemblies included in the system 500. However, this is merely exemplary; any suitable structure for making electrical connections between the modules or components 506 can be used.

In a particular embodiment, the system 500 can also include a processor such as the semiconductor chip 508, such that each module or component 506 can be configured to transfer a number N of data bits in parallel in a clock cycle, and the processor can be configured to transfer a number M of data bits in parallel in a clock cycle, M being greater than or equal to N.

In the example depicted in FIG. 5, the component 508 is a semiconductor chip and component 510 is a display screen, but any other components can be used in the system 500. Of course, although only two additional components 508 and 511 are depicted in FIG. 5 for clarity of illustration, the system 500 can include any number of such components.

Modules or components 506 and components 508 and 511 can be mounted in a common housing 501, schematically depicted in broken lines, and can be electrically interconnected with one another as necessary to form the desired circuit. The housing 501 is depicted as a portable housing of the type usable, for example, in a cellular telephone or personal digital assistant, and screen 510 can be exposed at the surface of the housing. In embodiments where a structure 506 includes a light-sensitive element such as an imaging chip, a lens 511 or other optical device also can be provided for routing light to the structure. Again, the simplified system shown in FIG. 5 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly, comprising:
   a circuit panel having first and second opposed surfaces and an address bus comprising a plurality of signal conductors electrically connected with a plurality of mutually exclusive connection regions, each connection region including first panel contacts and second panel contacts electrically coupled with the first panel contacts disposed at the first and second surfaces, respectively; and
   first and second microelectronic packages having first terminals mounted to the first panel contacts and the second panel contacts, respectively, each microelectronic package having first, second, and third microelectronic elements therein, each microelectronic element electrically coupled to the address bus via only one of the connection regions,
   wherein the first and third microelectronic elements of the first microelectronic package and the second microelectronic element of the second microelectronic package are electrically coupled to the address bus only at a first one of the connection regions, and
   wherein the second microelectronic element of the first microelectronic package and the first and third microelectronic elements of the second microelectronic package are electrically coupled to the address bus only at a second one of the connection regions.

2. The microelectronic assembly as claimed in claim 1, wherein the address bus is configured to carry all address signals usable by circuitry within the first and second microelectronic packages.

3. The microelectronic assembly as claimed in claim 1, wherein each of the microelectronic elements embodies a greater number of active devices to provide memory storage array function than any other function.

4. The microelectronic assembly as claimed in claim 1, wherein the first terminals of the first and second microelectronic packages are arranged at positions of first and second grids, and wherein the first and second grids are aligned with one another in x and y orthogonal directions parallel to the first and second surfaces of the circuit panel, the alignment being within a distance equal to a minimum pitch between adjacent terminals of the grids.

5. The microelectronic assembly as claimed in claim 1, further comprising third and fourth microelectronic packages having first terminals mounted to the first panel contacts and the second panel contacts, respectively, each of the third and fourth microelectronic packages having first, second, and third microelectronic elements therein, each microelectronic element electrically coupled to the address bus via only one of the connection regions,
   wherein the first and third microelectronic elements of the third microelectronic package and the second microelectronic element of the fourth microelectronic package are electrically coupled to the address bus only at a third one of the connection regions,
   wherein the second microelectronic element of the third microelectronic package and the first and third microelectronic elements of the fourth microelectronic package are electrically coupled to the address bus only at a fourth one of the connection regions, and
   wherein an electrical characteristic between the first and second connection regions is within a same tolerance of the electrical characteristic between the second and third connection regions.

6. The microelectronic assembly as claimed in claim 5, wherein the electrical characteristic is an electrical trace length.

7. The microelectronic assembly as claimed in claim 5, wherein the electrical characteristic is an electrical propagation delay.

8. The microelectronic assembly as claimed in claim 5, wherein the electrical characteristic is a characteristic impedance of the signal conductors.

9. The microelectronic assembly as claimed in claim 5, wherein the electrical characteristic is a difference in an electrical load applied to the address bus from the microelectronic elements connected with the respective connection region.

* * * * *